United States Patent
Degner et al.

(10) Patent No.: US 9,907,201 B2
(45) Date of Patent: Feb. 27, 2018

(54) OPTIMIZED VENT WALLS IN ELECTRONIC DEVICES

(71) Applicant: Apple Inc., Cupertino, CA (US)

(72) Inventors: Brett W. Degner, Menlo Park, CA (US); Bartley K. Andre, Menlo Park, CA (US); Jeremy D. Bataillou, San Francisco, CA (US); Jay S. Nigen, Mountain View, CA (US); Christiaan A. Ligtenberg, San Carlos, CA (US); Ron A. Hopkinson, Campbell, CA (US); Charles A. Schwalbach, Menlo Park, CA (US); Matthew P. Casebolt, Fremont, CA (US); Nicholas A. Rundle, San Jose, CA (US); Frank F. Liang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/625,098

(22) Filed: Feb. 18, 2015

(65) Prior Publication Data
US 2015/0163960 A1 Jun. 11, 2015

Related U.S. Application Data

(62) Division of application No. 13/627,231, filed on Sep. 26, 2012, now Pat. No. 8,964,383.

(60) Provisional application No. 61/657,505, filed on Jun. 8, 2012, provisional application No. 61/657,500, filed on Jun. 8, 2012, provisional application No. 61/657,492, filed on Jun. 8, 2012.

(51) Int. Cl.
G06F 1/20 (2006.01)
H05K 7/20 (2006.01)

(52) U.S. Cl.
CPC ........ H05K 7/20145 (2013.01); G06F 1/203 (2013.01); H05K 7/2039 (2013.01); Y10T 29/49002 (2015.01)

(58) Field of Classification Search
CPC ...... H05K 7/20; H05K 7/209; H05K 7/20972; H05K 13/00; G06F 1/20; G06F 1/203; F28F 7/00; F28F 3/02; F28D 15/04; F28D 15/02
USPC .............. 361/679.01, 679.09, 679.26, 679.3, 361/679.46–679.55, 688, 689–697, 361/700–712, 719–724; 165/80.2, 80.3, 165/80.4, 80.5, 104.19, 104.26, 185, 165/121–126; 312/223.2, 236, 265; 454/184; 257/712, 713, 722–724; 174/15.2, 16.1, 16.3
See application file for complete search history.

(56) References Cited

U.S. PATENT DOCUMENTS 5,862,037 A  1/1999 Behl
6,643,129 B2 * 11/2003 Fujiwara ................. G06F 1/203
                                                  165/104.33

(Continued)

*Primary Examiner* — Zachary M Pape
(74) *Attorney, Agent, or Firm* — Kilpatrick Townsend & Stockton

(57) ABSTRACT

The disclosed embodiments related to a component for use in a portable electronic device. The component includes a wall of the portable electronic device, containing an intake zone that includes a set of intake vents directed at a first angle toward one or more heat-generating components of the portable electronic device. The wall also includes an exhaust zone containing a set of exhaust vents directed at a second angle out of the portable electronic device.

36 Claims, 24 Drawing Sheets

(56) References Cited

U.S. PATENT DOCUMENTS

| | | | |
|---|---|---|---|
| 6,678,157 B1* | 1/2004 | Bestwick | G06F 1/20 165/104.34 |
| 6,804,115 B2* | 10/2004 | Lai | H05K 7/202 165/104.33 |
| 6,935,419 B2* | 8/2005 | Malone | F28F 3/02 165/146 |
| 7,385,811 B2* | 6/2008 | Kwong | G06F 1/203 361/679.48 |
| 7,394,653 B2 | 7/2008 | Cheng et al. | |
| 7,649,736 B2* | 1/2010 | Hongo | G06F 1/203 165/104.21 |
| 7,688,586 B2* | 3/2010 | Tomioka | G06F 1/203 165/121 |
| 7,800,899 B2* | 9/2010 | Kim | G06F 1/203 174/16.1 |
| 7,957,140 B2* | 6/2011 | Mongia | G06F 1/203 165/104.33 |
| 8,023,265 B2* | 9/2011 | Yang | F04D 25/0613 165/104.21 |
| 8,649,174 B2 | 2/2014 | Senatori | |
| 8,693,184 B2* | 4/2014 | Wu | G06F 1/203 165/104.33 |
| 8,760,862 B2* | 6/2014 | Wang | G06F 1/203 165/104.33 |
| 8,934,235 B2* | 1/2015 | Rubenstein | G06F 1/206 165/185 |
| 9,237,675 B2* | 1/2016 | Iwata | G06F 1/203 |
| 2004/0004817 A1 | 1/2004 | Greco | |
| 2004/0105233 A1* | 6/2004 | Lai | H05K 7/202 361/695 |
| 2006/0002081 A1* | 1/2006 | Hongo | G06F 1/203 361/691 |
| 2006/0012955 A1* | 1/2006 | Vinson | H05K 7/20727 361/695 |
| 2007/0076369 A1 | 4/2007 | Chen et al. | |
| 2007/0086157 A1* | 4/2007 | Ruch | G06F 1/203 361/679.46 |
| 2008/0002356 A1* | 1/2008 | Kwong | G06F 1/203 361/679.48 |
| 2008/0019093 A1* | 1/2008 | Hongo | G06F 1/203 361/693 |
| 2008/0128119 A1* | 6/2008 | Ali | G06F 1/203 165/104.33 |
| 2008/0135210 A1* | 6/2008 | Wang | F28D 15/0233 165/80.3 |
| 2009/0168332 A1* | 7/2009 | Mongia | G06F 1/203 361/679.48 |
| 2010/0328878 A1* | 12/2010 | Fujiwara | G06F 1/203 361/679.47 |
| 2011/0310549 A1 | 12/2011 | Murakami | |
| 2012/0026677 A1 | 2/2012 | Bhutani et al. | |
| 2012/0120593 A1 | 5/2012 | Senatori | |
| 2012/0229982 A1 | 9/2012 | Hata et al. | |

* cited by examiner

```
                                              ─2100
┌─────────────────────────────────────────────────────────┐
│  GENERATE A FLUID FLOW THROUGH A HEAT EXCHANGER IN A    │
│  CAVITY USING A FORCED-FLUID DRIVER SO THAT THERMAL     │
│  POWER ASSOCIATED WITH OPERATION OF INTEGRATED          │
│  CIRCUITS IN THE CAVITY IS TRANSPORTED OUT OF THE CAVITY│
│                          2110                           │
└─────────────────────────────────────────────────────────┘
                              ▼
┌─────────────────────────────────────────────────────────┐
│ GENERATE ADDITIONAL FLUID FLOWS THROUGH VERTICAL GAPS   │
│ BETWEEN THE HEAT EXCHANGER AND WALLS OF THE CAVITY      │
│ USING THE FORCED-FLUID DRIVER SO THAT THE ADDITIONAL    │
│ FLUID FLOWS THROUGH THE VERTICAL GAPS ARE LOCATED       │
│ ABOVE AND BELOW THE FLUID FLOW                          │
│                          2112                           │
└─────────────────────────────────────────────────────────┘
```

FIG. 21

┌─────────────────────────────────────────────┐
│ GENERATE A FLUID FLOW THROUGH A HEAT EXCHANGER IN A CAVITY
│ USING A FORCED-FLUID DRIVER SO THAT THERMAL POWER ASSOCIATED
│ WITH OPERATION OF INTEGRATED CIRCUITS IN THE CAVITY IS
│ TRANSPORTED OUT OF THE CAVITY
│ 2110
└─────────────────────────────────────────────┘
                        ↓
┌─────────────────────────────────────────────┐
│ GENERATE AN ADDITIONAL FLUID FLOW THROUGH A GAP BETWEEN THE
│ HEAT EXCHANGER AND A WALL OF THE CAVITY IN A HORIZONTAL PLANE OF
│ THE HEAT EXCHANGER USING THE FORCED-FLUID DRIVER SO THAT THE
│ ADDITIONAL FLUID FLOW FLOWS THROUGH THE GAP
│ 2212
└─────────────────────────────────────────────┘

┌─────────────────────────────────────────────────────────────┐
│ GENERATE FLUID FLOWS THROUGH A HEAT EXCHANGER IN A CAVITY USING │
│ A FORCED-FLUID DRIVER SO THAT THERMAL POWER ASSOCIATED WITH │
│ OPERATION OF INTEGRATED CIRCUITS IN THE CAVITY IS TRANSPORTED │
│ OUT OF THE CAVITY │
│ 2310 │
└─────────────────────────────────────────────────────────────┘
                              ↓
┌─────────────────────────────────────────────────────────────┐
│ DIRECT A CENTRAL FLUID FLOW AWAY FROM A ROTATABLE DISPLAY IN A │
│ PORTABLE ELECTRONIC DEVICE USING A HOUSING THAT AT LEAST │
│ PARTIALLY ENCLOSES A HINGE THAT FACILITATES A CONFIGURABLE │
│ ANGULAR POSITION OF THE ROTATABLE DISPLAY RELATIVE TO A PLANE OF │
│ A TOP CASE IN THE PORTABLE ELECTRONIC DEVICE │
│ 2312 │
└─────────────────────────────────────────────────────────────┘

FIG. 23

OPTIMIZED VENT WALLS IN ELECTRONIC DEVICES

RELATED APPLICATIONS

The instant application is a divisional of, and hereby claims priority to, pending U.S. patent application Ser. No. 13/627,231, titled "Optimized Vent Walls in Electronic Devices," by Brett W. Degner, Bartley K. Andre, Jeremy D. Bataillou, Jay S. Nigen, Christiaan A. Ligtenberg, Ron A. Hopkinson, Charles A. Schwalbach, Matthew P. Casebolt, Nicholas A. Rundle and Frank F. Liang, which was filed on 26 Sep. 2012. This application also claims priority now-expired U.S. provisional application No. 61/657,505, titled "Optimized Vent Walls in Electronic Devices," by Brett W. Degner, Bartley K. Andre, Jeremy D. Bataillou, Jay S. Nigen, Christiaan A. Ligtenberg, Ron A. Hopkinson, Charles A. Schwalbach, Matthew P. Casebolt, Nicholas A. Rundle, and Frank F. Liang, which was filed on 8 Jun. 2012; now-expired U.S. provisional application No. 61/657,500, titled "Heat Exchanger with Dual Bypass," by Jay S. Nigen and Brett W. Degner, which was filed on 8 Jun. 2012; and now-expired U.S. provisional application No. 61/657,492, titled "Fluid-Flow Bifurcation Using Clutch Barrel," by Brett W. Degner, Jay S. Nigen, Bartley K. Andre, and Jeremy D. Bataillou, which was filed on 8 Jun. 2012, each of these provisional applications having priority claimed by parent application Ser. No. 13/627,231. Each of these applications is incorporated by reference.

BACKGROUND

Field

The disclosed embodiments relate to techniques for facilitating heat transfer in electronic devices. More specifically, the disclosed embodiments relate to optimized vent walls in electronic devices.

Related Art

A modern portable electronic device typically contains a set of tightly packed components. For example, a laptop computer may include a keyboard, display, speakers, touchpad, battery, buttons, processor, memory, internal storage, and/or ports in an enclosure that is less than one inch thick, 8-11 inches long, and 12-16 inches wide. Moreover, most components in the portable electronic device generate heat, which must be dissipated to enable safe use of the portable electronic device and improve long-term reliability. For example, heat generated by components in a laptop computer may be transferred away from the components and out of the laptop computer to prevent damage to the components and increase user comfort and safety while operating the laptop computer.

However, heat-dissipation mechanisms for portable electronic devices generally involve the use of additional parts and/or materials. For example, heat sinks, cooling fans, heat pipes, thermal spreaders, and/or vents may be used to dissipate heat from components in a laptop computer. Such heat-dissipating parts and/or materials may take up space within the portable electronic devices and may add to the cost of the portable electronic devices.

In addition, the heat-dissipating parts and/or materials result in exhaust flows that often contain heated air. This heated air can impinge on a display in a portable electronic device, and may increase the temperature of the display and/or may create temperature gradients on the display. The optical properties of displays that contain liquid-crystal materials are often a function of temperature. Therefore, the temperature changes and/or gradients can cause color changes and other visual artifacts that can degrade the quality of the displayed image.

Hence, space-efficient designs for portable electronic devices may be facilitated by more efficient and/or smaller heat-dissipation mechanisms in the portable electronic devices, and may reduce temperature changes and/or gradients on displays.

SUMMARY

The disclosed embodiments provide a component for use in a portable electronic device. The component includes a wall of the portable electronic device, containing an intake zone that includes a set of intake vents directed at a first angle toward one or more heat-generating components of the portable electronic device. The wall also includes an exhaust zone containing a set of exhaust vents directed at a second angle out of the portable electronic device.

In some embodiments, the wall also includes one or more obstructed vents between the intake zone and the exhaust zone.

In some embodiments, material adjacent to an exhaust vent from the exhaust vents is removed to reduce a temperature of a hot spot in the material during the transfer of exhaust out of the portable electronic device.

In some embodiments, the temperature of the hot spot is further reduced by maintaining a thickness of the material between the exhaust vent and one or more of the intake vents.

In some embodiments, the material is removed using a T-cut.

In some embodiments, the portable electronic device is a laptop computer.

In some embodiments, the wall corresponds to a rear wall that is integrated into a top case of the laptop computer.

In some embodiments, the second angle directs exhaust out of the laptop computer to avoid a display of the laptop computer.

Another embodiment provides a portable electronic device that includes an external housing with a top case and a bottom case that each has inner surfaces that define an internal cavity. The internal cavity includes at least an integrated circuit that generates heat during operation of the portable electronic device. Moreover, a heat exchanger in the internal cavity, which is thermally coupled to the integrated circuit, transfers the thermal power away from the integrated circuit. Furthermore, a forced-fluid driver in the internal cavity drives a fluid flow through the heat exchanger and out of the portable electronic device via a fluid-flow port in the external housing so that, during operation of the portable electronic device, the thermal power is transported away from the heat exchanger. Note that there are vertical gaps between the heat exchanger and the top case and the bottom case so that, during operation of the portable electronic device, additional fluid flows through the vertical gaps are located above and below the fluid flow.

In some embodiments, the heat exchanger includes convective-cooling fins and/or the forced-fluid driver includes a fan. Moreover, the fluid flow and the additional fluid flows may include a gas, such as air.

After passing through the heat exchanger during operation of the portable electronic device, a temperature of the fluid flow may be higher than those of the additional fluid flows. Furthermore, the fluid-flow port may have a length, and mixing of the additional fluid flows and the fluid flow may be at most partial over the length.

In some embodiments, the interval cavity includes a heat pipe thermally coupled to the integrated circuit at an evaporator region of the heat pipe. During operation of the portable electronic device, the heat pipe may transport the thermal power from the evaporator region to a condenser region of the heat pipe, and the heat exchanger may be thermally coupled to the heat pipe at the condenser region.

Additionally, the internal cavity may include a duct, located above the heat exchanger and mechanically coupled to the top case, which guides one of the additional fluid flows over a top of the heat exchanger.

Another embodiment provides a portable electronic device that includes the external housing, the integrated circuit, the heat exchanger and the forced-fluid drive. However, in addition to or instead of the vertical gaps, there is a gap between the heat exchanger and a wall of the internal cavity in a horizontal plane of the heat exchanger so that an additional fluid flow flows through the gap. Once again, the fluid flow may have a higher temperature than that of the additional fluid flow, and mixing of the additional fluid flow and the fluid flow may be at most partial over the length of the fluid-flow port. Furthermore, the portable electronic device may include: a component adjacent to the wall of the internal cavity, where the gap is between the heat exchanger and the component; and a duct, located in the gap, which guides the additional fluid flow over the component.

Another embodiment provides a method for cooling a cavity in a portable electronic device. During operation of the portable electronic device, the forced-fluid driver generates the fluid flow through the heat exchanger in the cavity so that thermal power associated with operation of the integrated circuit in the cavity is transported out of the cavity. Moreover, the forced-fluid driver generates additional fluid flows through the vertical gaps between the heat exchanger and the walls of the cavity so that the additional fluid flows through the vertical gaps are located above and below the fluid flow.

Another embodiment provides a portable electronic device that includes an external housing with a top case and a bottom case that each has inner surfaces that define an internal cavity. The internal cavity includes at least an integrated circuit that generates heat during operation of the portable electronic device. Moreover, the portable electronic device includes a rotatable display that is mechanically coupled to the external housing by a hinge, where the rotatable display has a configurable angular position relative to a plane of the top case. Furthermore, the portable electronic device includes a housing (such as a clutch barrel) that at least partially encloses the hinge along an axis of rotation of the rotatable display. During operation of the portable electronic device, a fluid-flow port in the external housing directs fluid flows out of the internal cavity. These fluid flows include a central fluid flow sandwiched between two additional fluid flows, where the central fluid flow has a higher temperature than those of the additional fluid flows. Additionally, the housing directs the central fluid flow away from the rotatable display over a range of angular positions of the rotatable display.

In some embodiments, the portable electronic device includes a forced-fluid driver in the internal cavity that generates the fluid flows. For example, the forced-fluid driver may include a fan.

Moreover, the range of angular positions may include approximately 0° and approximately between 90° to 110°. When the angular position is approximately 0°, the housing may direct the central fluid flow out of the portable electronic device. Furthermore, when the angular position is approximately between 90° and 110°, the housing may direct the central fluid flow into the housing, and may direct one of the additional fluid flows to the rotatable display and another of the additional fluid flows out of the portable electronic device.

In some embodiments, during operation of the portable electronic device, the housing may reduce a flow impedance of another fluid flow in another fluid-flow port into the portable electronic device. Additionally, during operation of the portable electronic device, the housing may direct a portion of the other fluid flow over at least the integrated circuit.

Note that the fluid flow and the additional fluid flows may include a gas, such as air.

Another embodiment provides a method for cooling a cavity in a portable electronic device. During operation of the portable electronic device, the forced-fluid driver generates the fluid flows through the fluid-flow port so that thermal power associated with operation of at least an integrated circuit in the cavity is transported out of the cavity, where the fluid flows include the central fluid flow sandwiched between two additional fluid flows, and the central fluid flow has the higher temperature than those of the additional fluid flows. Moreover, the housing directs the central fluid flow away from the rotatable display in the portable electronic device that at least partially encloses the hinge that facilitates the configurable angular position of the rotatable display relative to the plane of the top case in the portable electronic device. Note that the central fluid flow is directed away from the rotatable display over the range of angular positions of the rotatable display.

In some embodiments, the housing reduces the flow impedance of the other fluid flow in the other fluid-flow port into the portable electronic device. Additionally, the housing may direct the portion of the other fluid flow over at least the integrated circuit.

BRIEF DESCRIPTION OF THE FIGURES

FIG. 21 is a flowchart illustrating a method for cooling a cavity in the portable electronic device of FIG. 15 in accordance with an embodiment of the present disclosure.

FIG. 22 is a flowchart illustrating a method for cooling a cavity in the portable electronic device of FIG. 16 in accordance with an embodiment of the present disclosure.

FIG. 23 is a flowchart illustrating a method for cooling a cavity in the portable electronic device of FIGS. 17-20 in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Figure 1:
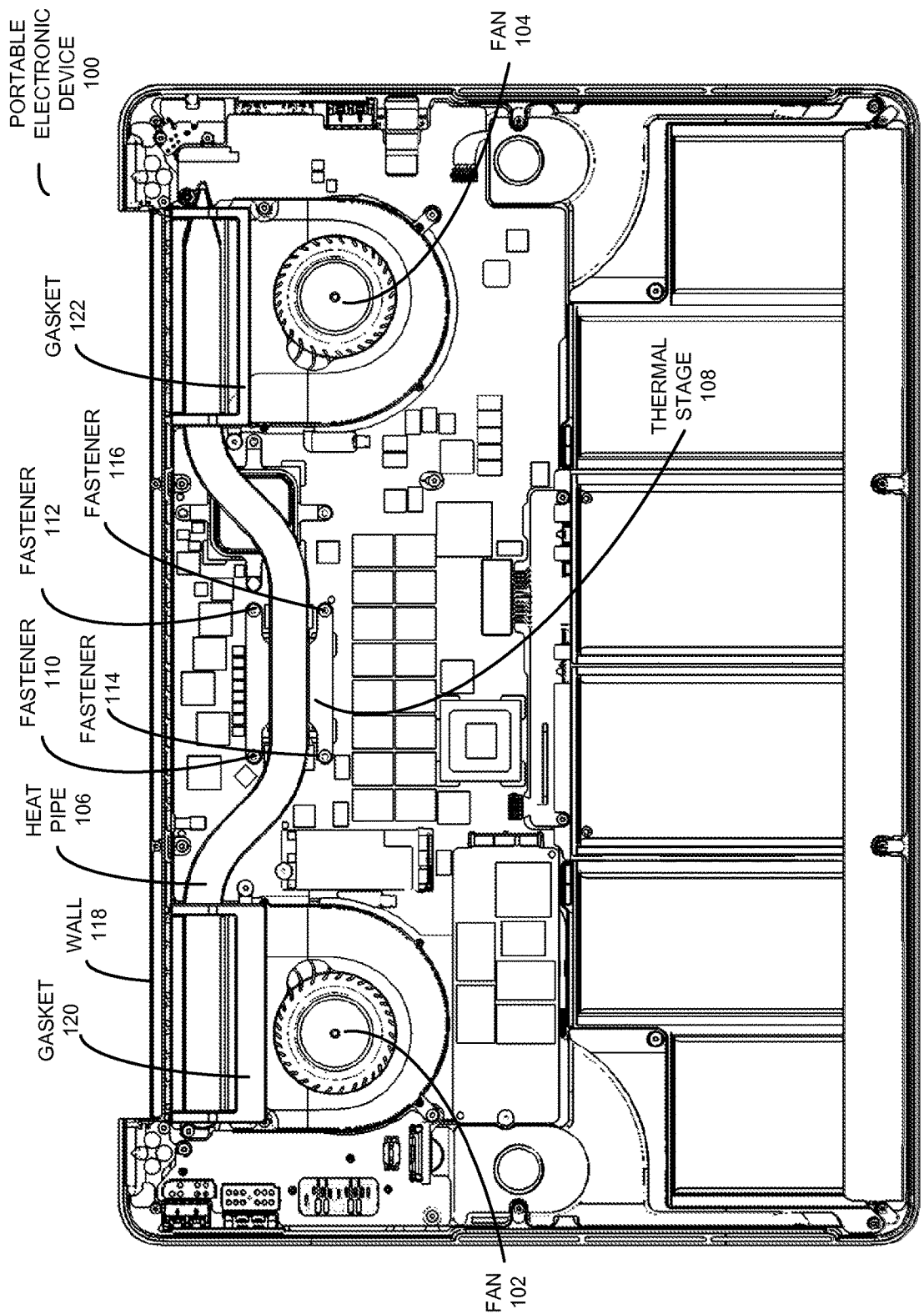
FIG. 1 is a block diagram illustrating a bottom view of a portable electronic device in accordance with an embodiment of the present disclosure.

FIG. 1 shows a bottom view of a portable electronic device 100, such as a laptop computer, with the bottom of the enclosure of portable electronic device 100 removed. Within portable electronic device 100, a number of components may be used to cool heat-generating components such as central-processing units (CPUs), graphics-processing units (GPUs), and/or video memory.

First, portable electronic device 100 may include a set of fans 102-104 for expelling heat generated by the heat-generating components outside portable electronic device 100. Fans 102-104 may utilize a set of intake and exhaust vents along a wall 118 of portable electronic device 100 to draw in cooler air from outside portable electronic device 100, circulate the air around the interior of portable electronic device 100 to dissipate heat from the heat-generating components, and expel the heated air out of portable electronic device 100.

Portable electronic device 100 may also include a heat pipe 106 that conducts heat away from one or more of the heat-generating components toward the flow of exhaust from fans 102-104. For example, heat pipe 106 may be a sealed pipe of a thermally conductive material, such as copper, filled with a working fluid such as: water, ethanol, acetone, sodium, and/or mercury in a partial vacuum. The working fluid may evaporate to vapor at the thermal interface with a heat-generating component closer to the center of heat pipe 106, migrate to an end of heat pipe 106 that is cooled by a fan (e.g., fans 102-104), and condense back into liquid after the heat is removed by the fan. A sintered material (e.g., metal powder) in the interior of heat pipe 106 may then exert capillary pressure on the condensed liquid, conducting the liquid back to the heated portion of heat pipe 106 for subsequent transfer of heat away from the heat-generating component.

To further facilitate heat dissipation from the heat-generating component, a thermal stage 108 may apply a spring force between heat pipe 106 and the heat-generating component. For example, thermal stage 108 may be bonded to heat pipe 106 using a solder and fastened to a surface within portable electronic device 100 using a set of fasteners 110-116 to increase the amount of heat transferred along a thermal interface between the heat-generating component and heat pipe 106.

In one or more embodiments, heat-dissipation mechanisms and/or components in portable electronic device 100 may include a number of characteristics and/or features that increase the transfer of heat away from the heat-generating components and/or facilitate efficient use of space within portable electronic device 100. First, fasteners 110-116 may both fasten thermal stage 108 to a surface within portable electronic device 100 and create a thermal gap between heat pipe 106 and the enclosure of portable electronic device 100, as discussed below with respect to FIG. 2. Second, thermal stage 108 may include two thicknesses to reduce an overall thickness of portable electronic device 100 while maintaining the spring force necessary to adequately cool the heat-generating component over which thermal stage 108 and heat pipe 106 are disposed, as described in further detail below with respect to FIGS. 3-4.

Third, wall 118 may include intake vents that are directed at a first angle toward one or more heat-generating components of portable electronic device 100 and exhaust vents directed at a second angle out of portable electronic device 100 to avoid a display of portable electronic device 100. Wall 118 may also include one or more obstructed vents between the intake and exhaust vents, as well as mechanisms for reducing the temperature of hot spots in the enclosure of portable electronic device 100. Wall 118 is described in further detail below with respect to FIGS. 5-8.

Finally, a set of gaskets 120-122 may provide thermal ducts between fans 102-104 and exhaust vents in wall 118 to prevent exhaust from recirculating inside portable electronic device 100 and reducing the effectiveness of heat dissipation from the heat-generating components. As discussed below with respect to FIGS. 9-11, gaskets 120-122 may include a rigid section that forms the duct, as well as a set of flexible sections that simplify assembly of heat pipe 106 on top of the rigid section and subsequently seal the duct around heat pipe 106.

Figure 2:
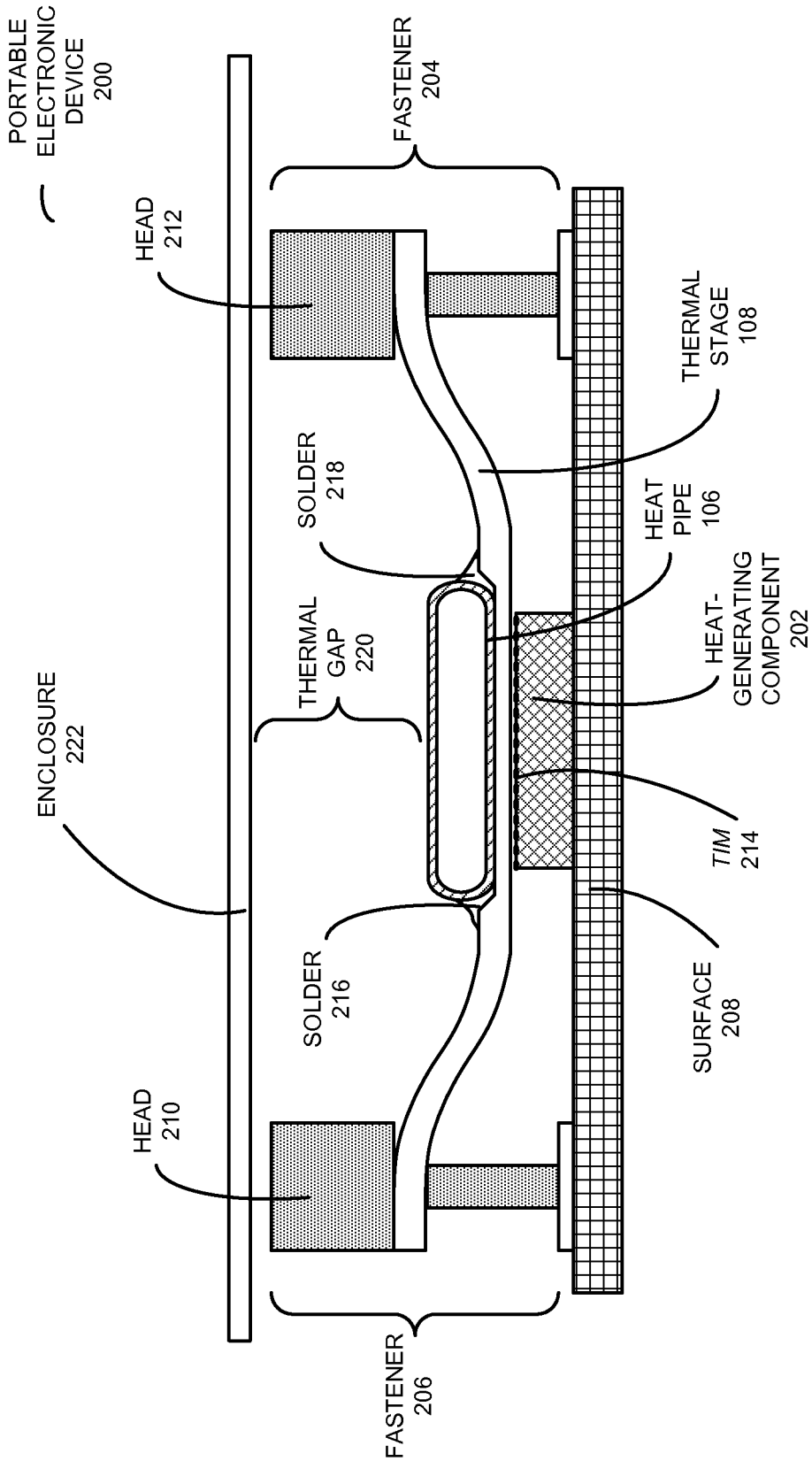
FIG. 2 is a block diagram illustrating a cross-sectional view of a system for facilitating heat transfer in a portable electronic device in accordance with an embodiment of the present disclosure.

FIG. 2 shows a cross-sectional view of a system for facilitating heat transfer in a portable electronic device 200 (e.g., portable electronic device 100 of FIG. 1). The system includes heat pipe 106 and thermal stage 108, both of which are disposed over a heat-generating component 202 such as a CPU and/or GPU.

As shown in FIG. 2, thermal stage 108 may be disposed along a thermal interface in between heat pipe 106 and heat-generating component 202. A thermal interface material (TIM) 214 may also be disposed within the thermal interface between heat-generating component 202 and thermal stage 108 to increase the thermal contact conductance between heat-generating component 202 and thermal stage 108.

In one or more embodiments, the spring force of thermal stage 108 is used to increase thermal contact between heat-generating component 202 and heat pipe 106. For example, thermal stage 108 may improve heat conduction between heat-generating component 202 and heat pipe 106 by reducing the thickness and, in turn, the thermal resistance of TIM 214. As a result, thermal stage 108 may be made of a material with a high thermal conductivity and spring constant, such as copper titanium.

To provide thermal contact between heat-generating component 202 and heat pipe 106, heat pipe 106 may be joined to thermal stage 108 using a solder 216-218, and thermal stage 108 may be fastened to a surface 208 within portable electronic device 200 using a set of fasteners 204-206 (e.g., fasteners 110-116 of FIG. 1). For example, fasteners 204-206 may include one or more screws that fasten a set of wings of thermal stage 108 to a printed circuit board (PCB) containing heat-generating component 202. Fasteners 204-206 and thermal stage 108 may thus apply downward force onto heat-generating component 202 and increase the thermal coverage of heat-generating component 202 by heat pipe 106.

Fasteners 204-206 may additionally form a thermal gap 220 between heat pipe 106 and an enclosure 222 of portable electronic device 200. Continuing with the above example, screws used to provide fasteners 204-206 may have tall heads 210-212 that provide a 0.5 mm-0.8 mm thermal gap 220 and/or plenum through which air may flow to further cool heat-generating component 202 and/or other heat-generating components in portable electronic device 200. Alternatively, other types of fasteners 204-206 may be used to provide thermal gap 220, including: clips, barbed fasteners, bolts, clamps, pins, pegs, and/or clasps.

Thermal gap 220 may also prevent heat pipe 106 from thermally contacting enclosure 222 if portable electronic device 200 is dropped and/or impacts another object. For example, fasteners 204-206 may be placed around heat-generating component 202 if heat-generating component 202 is located relatively far from an attachment point of a metal enclosure 222 to ensure that trampolining in enclosure 222 does not cause heat pipe 106 to transfer heat to enclosure 222 and/or a surface contacting enclosure 222. Fasteners 204-206 may further be attached to a surface (e.g., the center of a PCB) with lower stiffness so that the impact does not damage heat-generating component 202 and/or other nearby components.

However, the proximity of fasteners 204-206 to enclosure 222 may result in physical contact between fasteners 204-206 and enclosure 222. For example, fasteners 204-206 may touch enclosure 222 if fasteners 204-206 are designed to be intimate with enclosure 222 and/or if fasteners 204-206 are brought in contact with enclosure 222 during impact between enclosure 222 and a hard object.

As a result, fasteners 204-206 may include an insulating material to prevent fasteners 204-206 from heating enclosure 222 in the event of physical contact between the fasteners 204-206 and enclosure 222. For example, fasteners 204-206 may be made of plastic to reduce thermal conduction between fasteners 204-206 and enclosure 222. Consequently, fasteners 204-206 may improve thermal contact between heat-generating component 202 and heat pipe 106, provide thermal gap 220 as a channel for airflow and/or heat dissipation from heat-generating component 202 and/or heat pipe 106, and facilitate safe operation of portable electronic device 200 by thermally insulating enclosure 222 from heat-generating component 202 and/or heat pipe 106.

Figure 3:
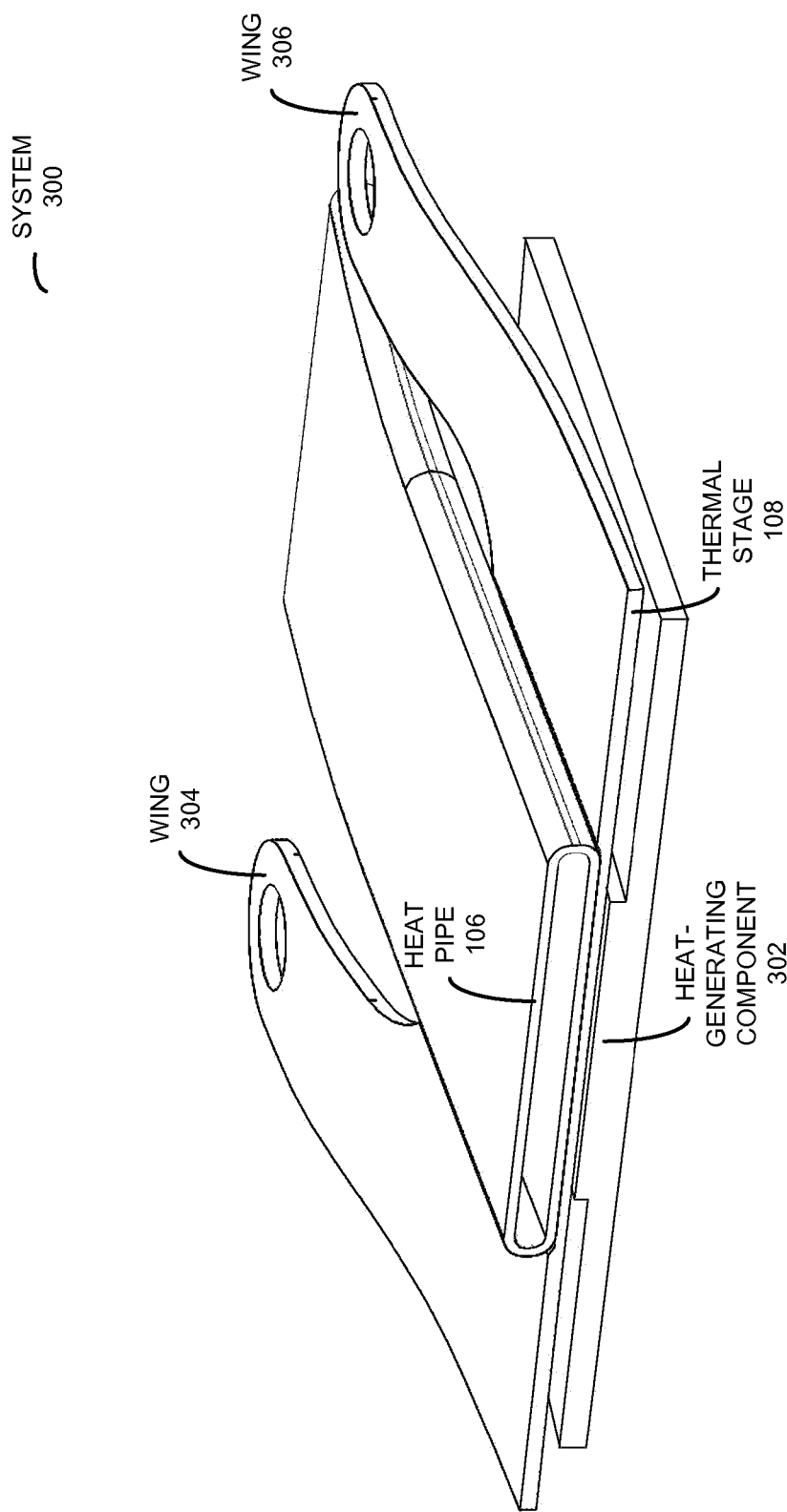
FIG. 3 is a block diagram illustrating a sectional view of a system for facilitating heat transfer in a portable electronic device in accordance with an embodiment of the present disclosure.

FIG. 3 shows a sectional view of a system 300 for facilitating heat transfer in a portable electronic device. As mentioned above, system 300 may include heat pipe 106 and thermal stage 108, both of which are disposed over a heat-generating component 302 (e.g., a CPU). Heat pipe 106 may be soldered to thermal stage 108, and a set of wings 304-306 of thermal stage 108 may be fastened to a surface within the portable electronic device to apply a spring force to heat-generating component 302. For example, the fastening of wings 304-306 that are angled upward to a PCB containing heat-generating component 302 may apply a downward force onto heat-generating component 302 and increase the thermal contact conductance between heat-generating component 302 and heat pipe 106.

Figure 4:
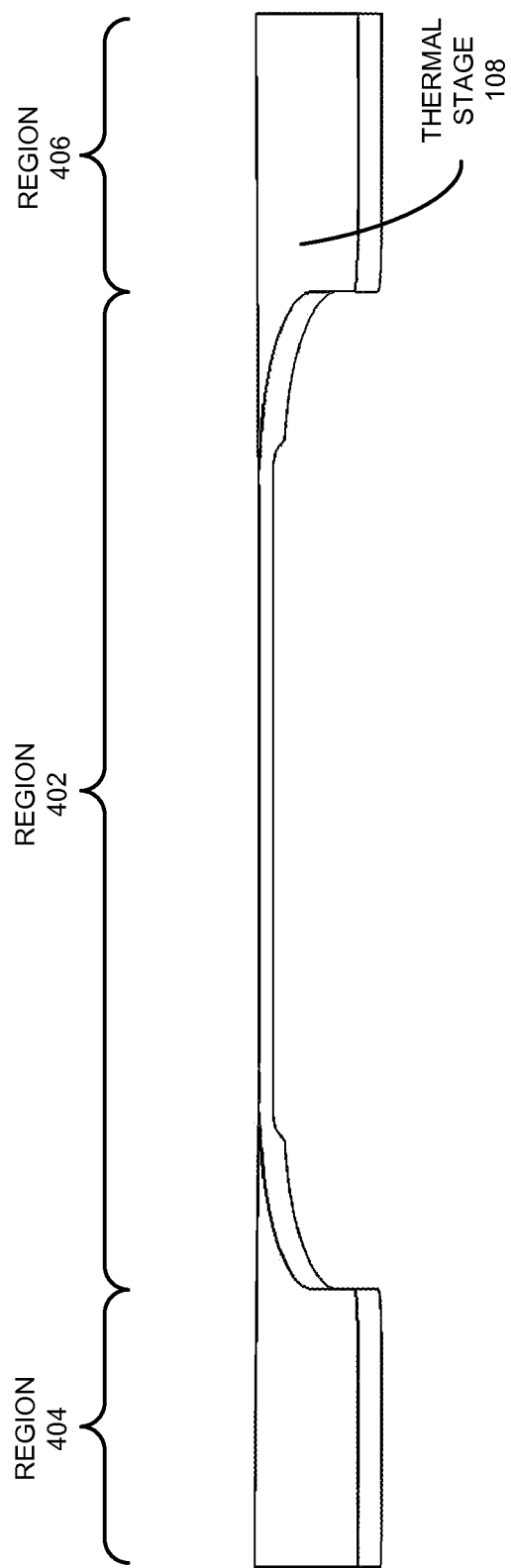
FIG. 4 is a block diagram illustrating a side view of a thermal stage in accordance with an embodiment of the present disclosure.

FIG. 4 shows a side view of thermal stage 108. Thermal stage 108 may include a number of regions 404-406 with different thicknesses. In particular, region 402 may be of a first thickness, and regions 404-406 may be of a second thickness that is greater than the first thickness.

The first and/or second thicknesses may be created in thermal stage 108 using a number of techniques. For example, a machining technique may be used to form a trough in a material (e.g., copper titanium) of uniform stock thickness. Similarly, a profile corresponding to the first thickness may also be formed in raw stock using a rolling technique. The first thickness may further be created by removing material from uniform stock using a skiving technique, continuous machining technique, and/or chemical-etching technique. A forging and/or coining technique may be used to press the first thickness into uniform stock, or a casting technique may be used to form the first and second thicknesses from a mold.

As mentioned above, the first thickness may accommodate a heat pipe (e.g., heat pipe 106 of FIG. 1). For example, the first thickness may form a notch and/or groove within which the heat pipe may be placed to reduce an overall thickness of the portable electronic device containing thermal stage 108 and the heat pipe. On the other hand, the second thickness may increase a spring force between a heat-generating component and the heat pipe, allowing for better thermal transfer between the heat-generating component (e.g., a high-power CPU) and the heat pipe. For example, the second thickness may be used in the wings (e.g., wings 304-306 of FIG. 3) of thermal stage 108 to increase the downward force applied by thermal stage 108 and/or a set of fasteners (e.g., fasteners 110-116 of FIG. 1) onto the top of the heat-generating component. Consequently, the first and second thicknesses may facilitate both efficient use of space within the portable electronic device and increased cooling of the heat-generating component by the heat pipe.

Figure 5:
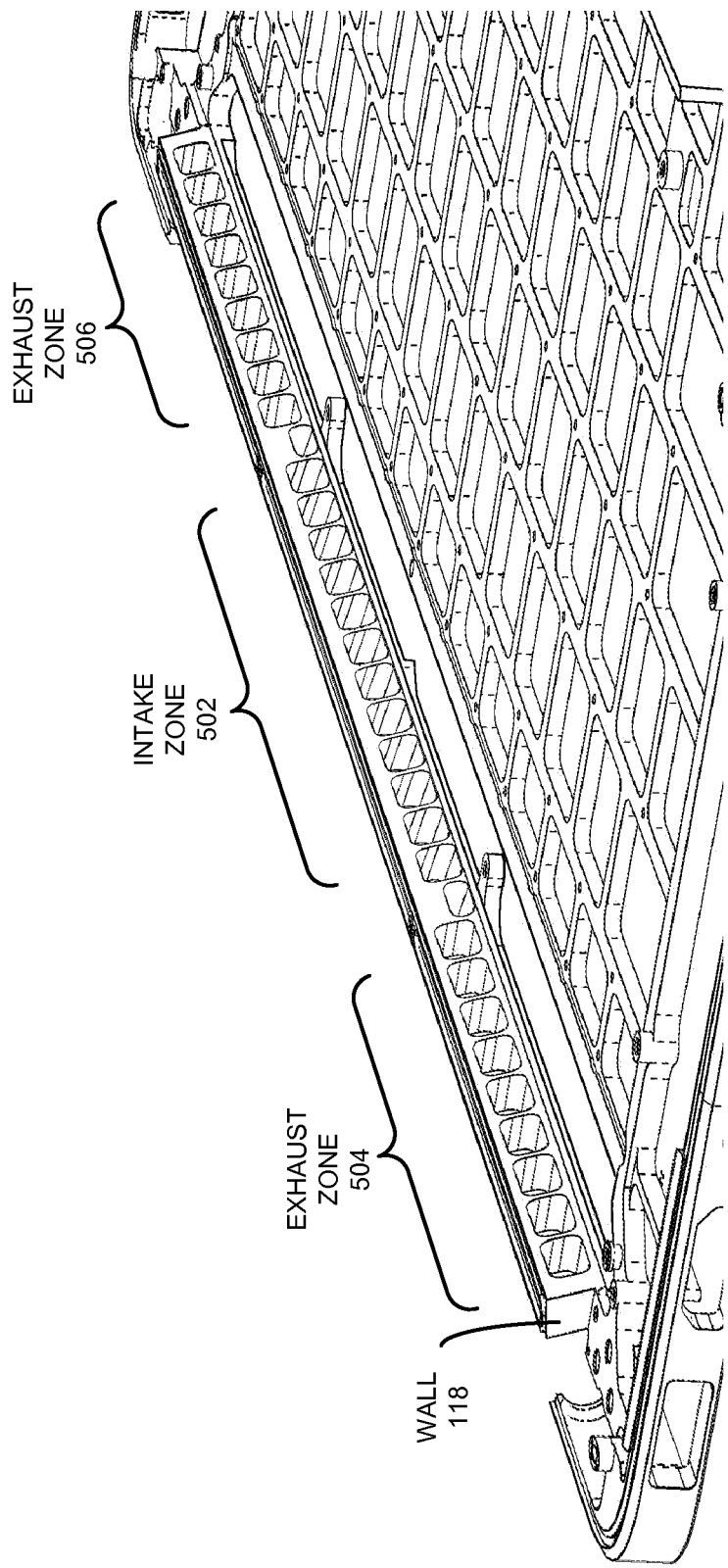
FIG. 5 is a block diagram illustrating a wall in a portable electronic device in accordance with an embodiment of the present disclosure.

FIG. 5 shows wall 118. Wall 118 may be a rear wall of a portable electronic device, such as a laptop computer. The rear wall may be integrated into a top case of the laptop computer to reduce the number of seams and/or components in the laptop computer's enclosure. For example, instead of creating wall 118 as a separate part and subsequently joining wall 118 to the top case, wall 118 may be machined out of the top case. In turn, the reduced number of seams and/or components in the enclosure may mitigate electromagnetic interference caused by the enclosure and/or improve the rigidity and/or height tolerance of the enclosure.

As shown in FIG. 5, wall 118 includes an intake zone 502 and two exhaust zones 504-506. Intake zone 502 includes a set of intake vents around the center of wall 118 that allow a set of fans (e.g., fans 102-104 of FIG. 1) to draw cooler air from the exterior of the portable electronic device into the portable electronic device. The fans may then circulate the air inside a set of plenums and/or thermal gaps (e.g., thermal gap 220 of FIG. 2) within the portable electronic device and expel the heated air out of the portable electronic device through a set of exhaust vents in exhaust zones 504-506 on either side of intake zone 502. As discussed in further detail below with respect to FIGS. 7-8, the intake vents may be directed at a first angle toward one or more heat-generating components of the portable electronic device, and the exhaust vents may be directed at a second angle out of the portable electronic device.

Figure 6:
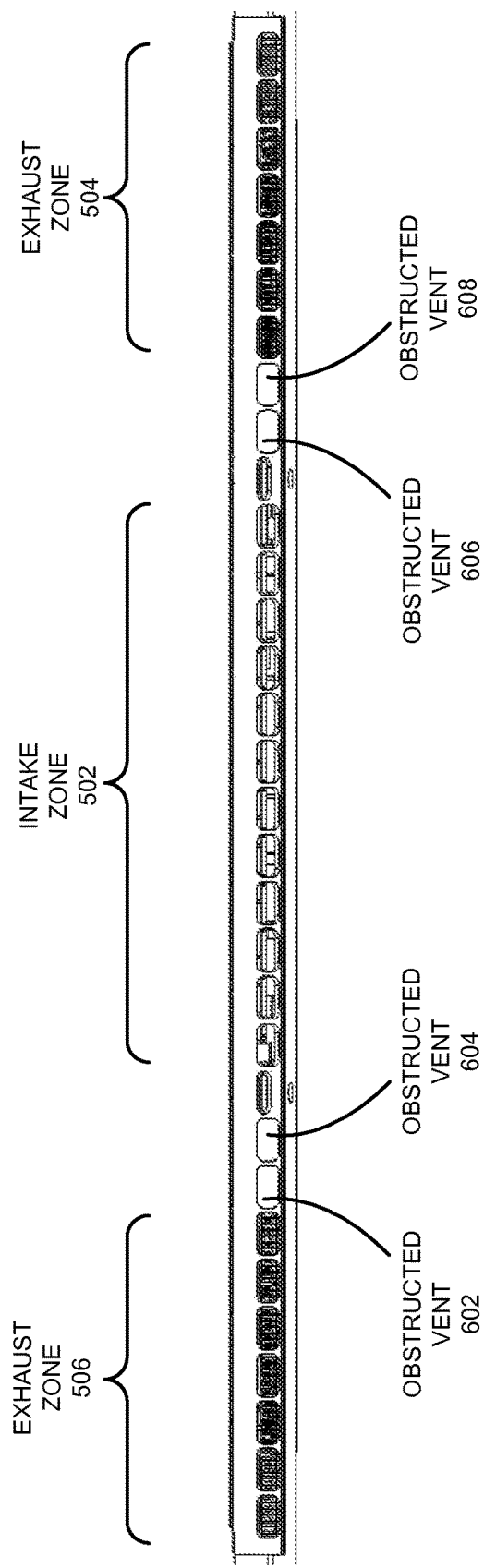
FIG. 6 is a block diagram illustrating a rear view of a set of intake and exhaust zones in a portable electronic device in accordance with an embodiment of the present disclosure.

FIG. 6 shows a rear view of a set of intake and exhaust zones 502-506 of a portable electronic device. As described above (and further below with respect to FIG. 17), intake zone 502 may include a set of intake vents that are used by fans to draw in air from outside the portable electronic device, while each exhaust zone 504-506 may include a set of exhaust vents that are used by the fans to expel heated air out of the portable electronic device.

In addition, a set of obstructed vents 602-608 may separate intake zone 502 from exhaust zones 504-506. Air flow from vents 602-608 may be blocked from the inside of the portable electronic device by a portion of a duct formed by a gasket in the portable electronic device, as described below with respect to FIG. 10. Such obstruction of substantially evenly spaced openings in intake and exhaust zones 502 and exhaust zones 504-506 may maintain the cosmetic continuity of the vents in intake and exhaust zones 502-506, reduce electromagnetic interference from the enclosure of the portable electronic device, and facilitate heat dissipation in the portable electronic device by separating the intake and exhaust flows passing through intake and exhaust zones 502-506, respectively.

Figure 7:
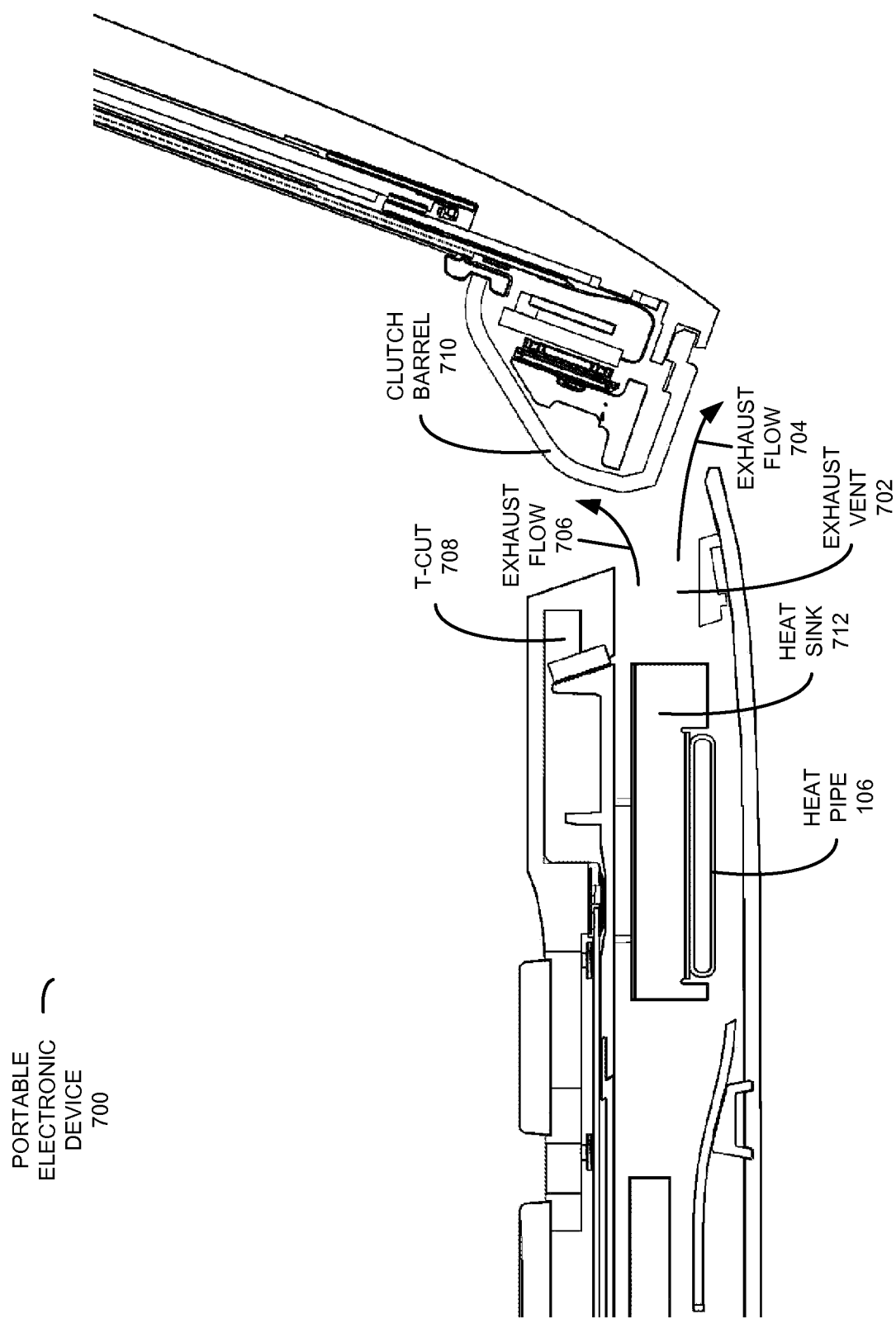
FIG. 7 is a block diagram illustrating a cross-sectional view of a portable electronic device in accordance with an embodiment of the present disclosure.

FIG. 7 shows a cross-sectional view of a portable electronic device 700. More specifically, FIG. 7 shows a cross-sectional view of an exhaust vent 702 from an exhaust zone (e.g., exhaust zones 504-506 of FIG. 5) in a wall (e.g., wall 118 of FIG. 1) of portable electronic device 700. Air from the interior of portable electronic device 700 may be moved by a fan (e.g., fans 102-104 of FIG. 1) across heat pipe 106 and a heat sink 712, where the air is heated and expelled as exhaust out of exhaust vent 702.

In addition, as described further below with reference to FIG. 20, two flows 704-706 of exhaust out of vent 702 may be created by a clutch barrel 710 connecting a display of portable electronic device 700 (e.g., a laptop computer) to the bottom portion of portable electronic device 700. Flow 704 may exit portable electronic device 700 along the bottom of clutch barrel 710, while flow 706 may exit portable electronic device 700 over the top of clutch barrel 710. To prevent exhaust from changing the white point of and/or accelerating degradation in the display, exhaust vent 702 may be directed at an angle out of portable electronic device 700 so that exhaust flows 704-706 avoid the display and/or do not create a large temperature gradient across the display. If the display is closed over the bottom portion of portable electronic device 700, flow 706 may cease, and all exhaust may be expelled out of vent 702 through an air gap between the bottom of portable electronic device 700 and clutch barrel 710.

Those skilled in the art will appreciate that exhaust flowing out of exhaust vent 702 may also heat material in the wall near exhaust vent 702 and create a hot spot in the enclosure of portable electronic device 700. As a result, a T-cut 708 may be made in the material to reduce the thickness of the material and, in turn, the transfer of heat through the material. At the same time, the thickness of the material between exhaust vent 702 and one or more intake vents in portable electronic device 700 may be maintained to facilitate lateral conduction of heat from exhaust vent 702 to the intake vent(s), thus further reducing the temperature of the hot spot. Consequently, the relatively large size of exhaust vent 702, T-cut 708, and/or ridges at the bottom of exhaust vent 702 may provide a lightweight structure with thermally minimal spars, a reduced conduction path to both the top and bottom enclosures of portable electronic device 700, and a lateral conduction path between the exhaust and intake zones in the wall.

Figure 8:
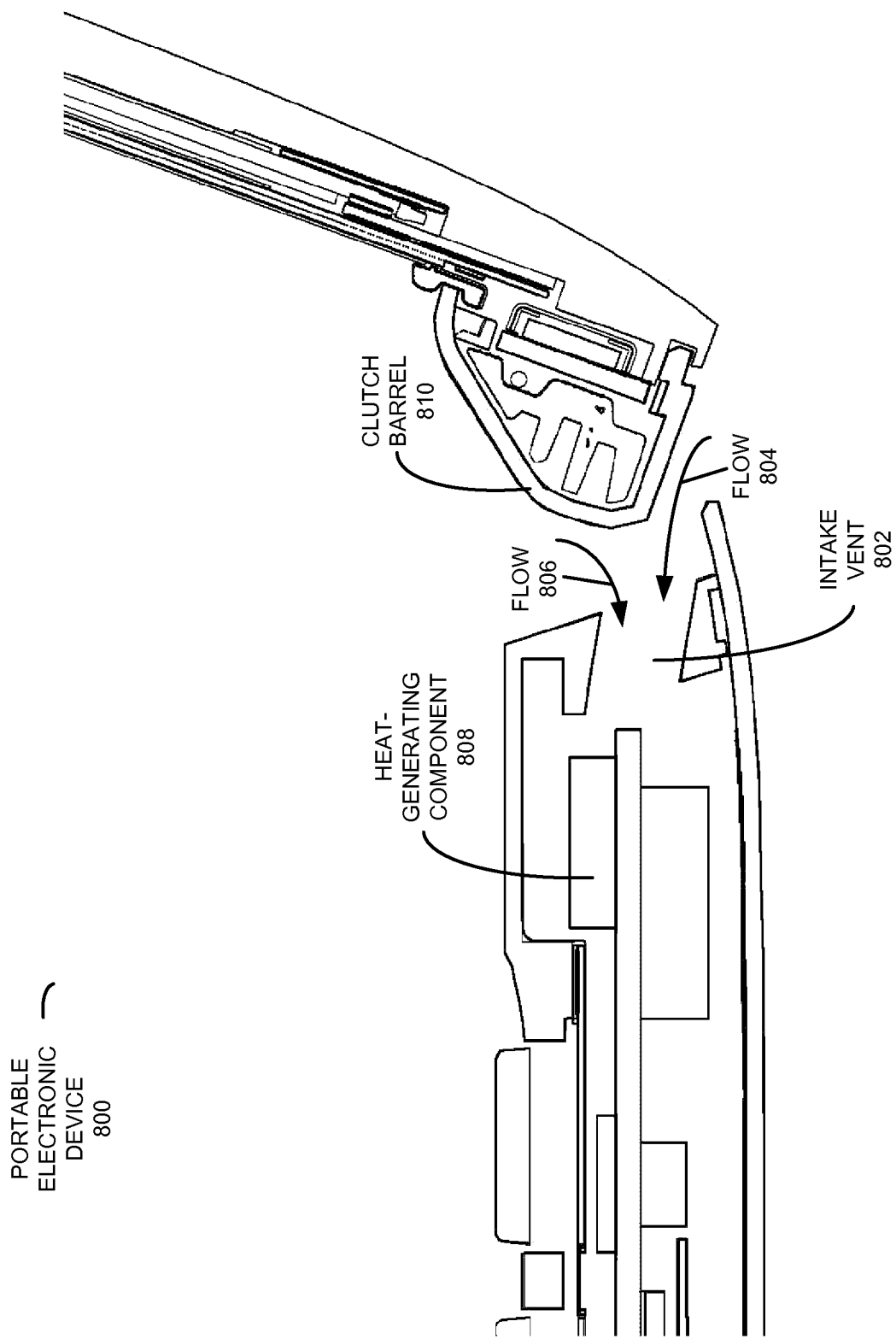
FIG. 8 is a block diagram illustrating a cross-sectional view of a portable electronic device in accordance with an embodiment of the present disclosure.

FIG. 8 shows a cross-sectional view of a portable electronic device 800. In particular, FIG. 8 shows a cross-sectional view of an intake vent 802 from an intake zone (e.g., intake zone 502 of FIG. 5) in a wall (e.g., wall 118 of FIG. 1) of portable electronic device 800. Intake vent 802 may allow cooler air from outside portable electronic device 800 to be drawn into portable electronic device 800 by a fan (e.g., fans 102-104 of FIG. 1) and circulated within portable electronic device 800 before being expelled as exhaust out of one or more exhaust vents (e.g., exhaust vent 702 of FIG. 7) in the wall.

Two flows 804-806 of air may pass through intake vent 802 while a display of portable electronic device 800 (e.g., a laptop computer) is open. Flow 804 may enter portable electronic device 800 along the bottom of a clutch barrel 810 connecting the display to the bottom of portable electronic device 800, while flow 806 may enter portable electronic device 800 from the top of clutch barrel 810. If the display is closed over the bottom of portable electronic device 800, flow 806 may cease, and all air drawn in through intake vent 802 may flow 804 from an air gap between the bottom of portable electronic device 800 and clutch barrel 810.

Moreover, intake vent 802 may be directed at an upward angle toward a heat-generating component 808 of portable electronic device 800 to facilitate heat dissipation from heat-generating component 808. For example, intake vent 802 may channel air over the top of a PCB containing video memory to cool the video memory and/or other heat-generating components at the top of the PCB. As a result, air passing through intake vent 802 may dissipate heat from heat-generating component 808 better than air passing through an intake vent that is not angled upwards into the interior of portable electronic device 800.

Figure 9:
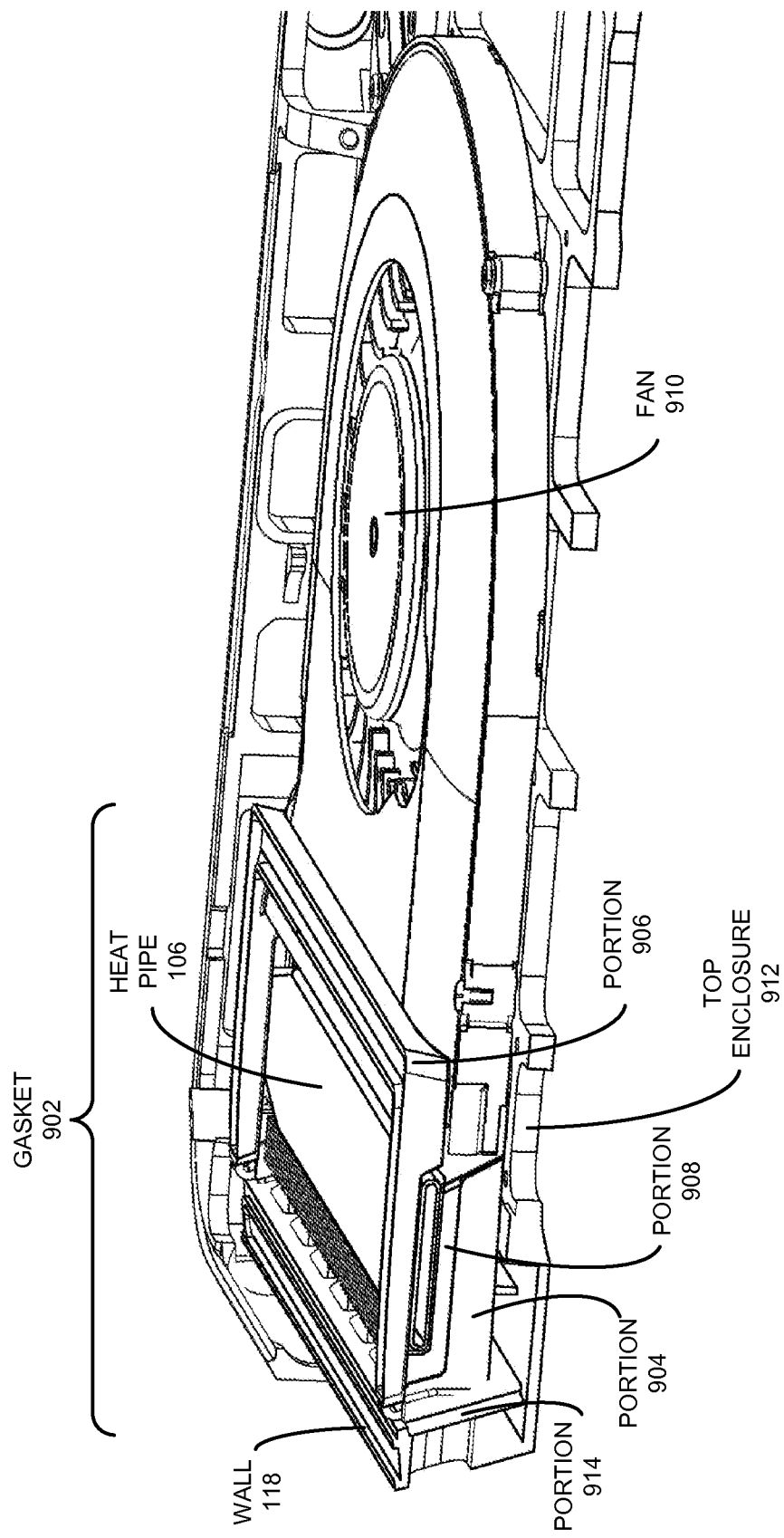
FIG. 9 is a block diagram illustrating a gasket in a portable electronic device in accordance with an embodiment of the present disclosure.

FIG. 9 shows a gasket 902 (e.g., gaskets 120-122 of FIG. 1) in a portable electronic device. As mentioned above, gasket 902 may form a thermal duct between a fan 910 and a set of exhaust vents in wall 118 to prevent exhaust from recirculating inside the portable electronic device and reducing the effectiveness of heat dissipation from heat-generating components in the portable electronic device.

As shown in FIG. 9, gasket 902 may include three portions 904-908. A rigid portion 904 may be disposed around a bottom of heat pipe 106 to form the duct between fan 910 and wall 118. Two flexible portions 904-906 may then be bonded to rigid portion 904 so that gasket 902 is manufactured as a single component instead of multiple components that require multiple steps to assemble into gasket 902. For example, flexible portions 904-906 may be made of a rubber that is bonded to a rigid portion 904 made of plastic using an overmolding technique.

Portion 906 may be a flap that is open during assembly of heat pipe 106 in the portable electronic device to allow heat pipe 106 to be placed over portions 904 and 908. Portion 906 may then be closed over heat pipe 106 and portions 904 and 908 to seal the duct around heat pipe 106 after the assembly. Portions 904-906 may further seal the duct around fan 910, a bottom enclosure (not shown) of the portable electronic device, a top enclosure 912 of the portable electronic device, and/or exhaust vents in wall 118. For example, portion 906 may fold over portions 904 and 908 to seal along the top of fan 910, the top and/or sides of heat pipe 106, and/or the bottom enclosure. On the other hand, portion 908 may be bonded to one or more edges of portion 904 and seal along the bottom of fan 910, the bottom and/or sides of heat pipe 106, top enclosure 912, and/or wall 118. Gasket 902 may also include an additional flexible portion 914 that seals the duct along wall 118. Alternatively, portion 914 may be provided by a separate component (e.g., a gasket) disposed between gasket 902 and wall 118.

Figure 10:
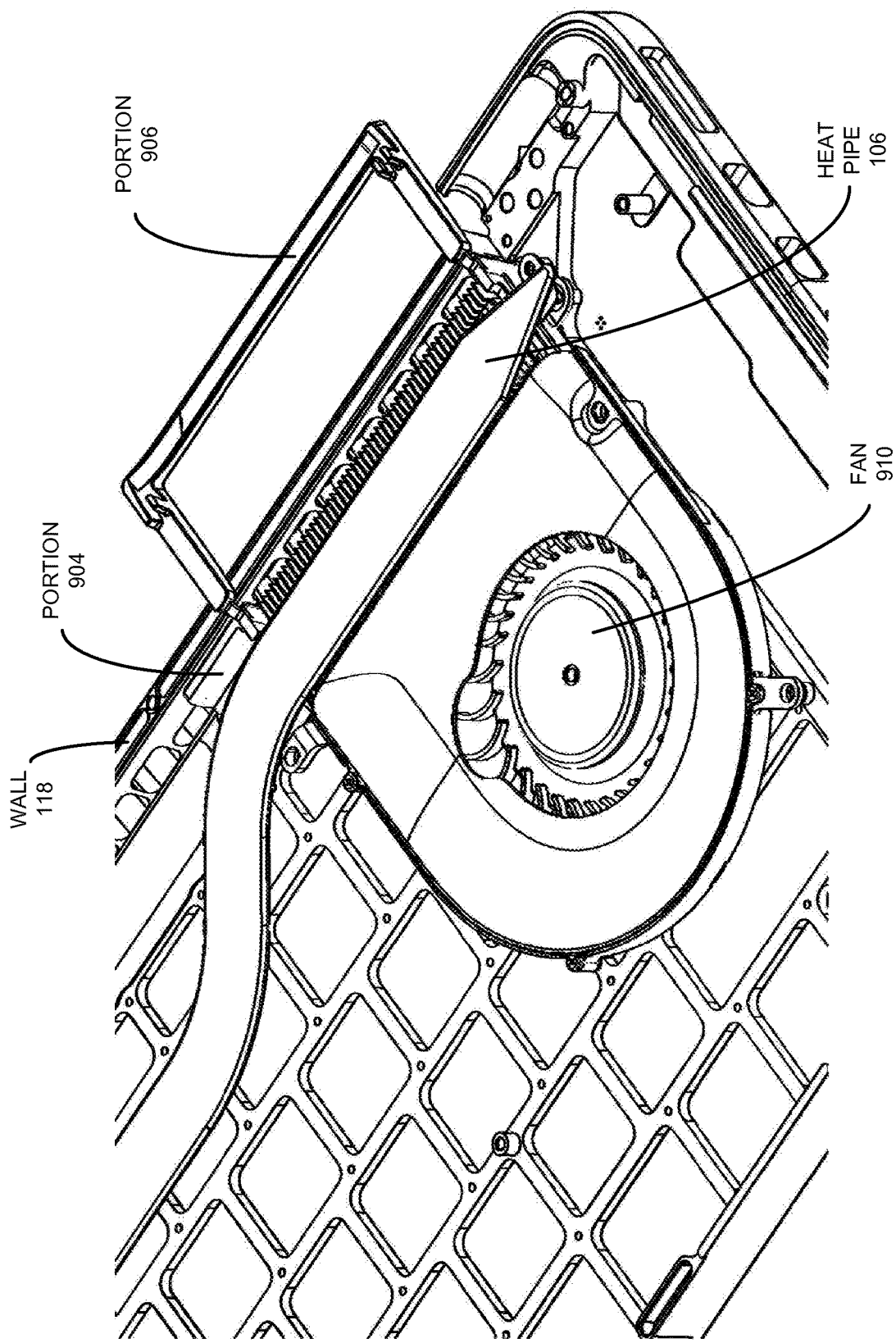
FIG. 10 is a block diagram illustrating a flexible portion of a gasket in accordance with an embodiment of the present disclosure.

FIG. 10 shows flexible portion 906 of a gasket (e.g., gasket 902 of FIG. 9). As mentioned above, portion 906 includes a flap that is open during assembly of heat pipe 106 in the portable electronic device. For example, the portable electronic device may be assembled by placing the gasket into the top enclosure of the portable electronic device with portion 906 open over wall 118. After the gasket is placed into the top enclosure of the portable electronic device, a part of rigid portion 904 may obstruct one or more vents in wall 118 to separate the intake and exhaust zones of wall 118. Next, fan 910 may be placed next to the gasket, and heat pipe 106 may be placed on top of rigid portion 904 and/or a second flexible portion (e.g., portion 908 of FIG. 9) of the gasket.

Figure 11:
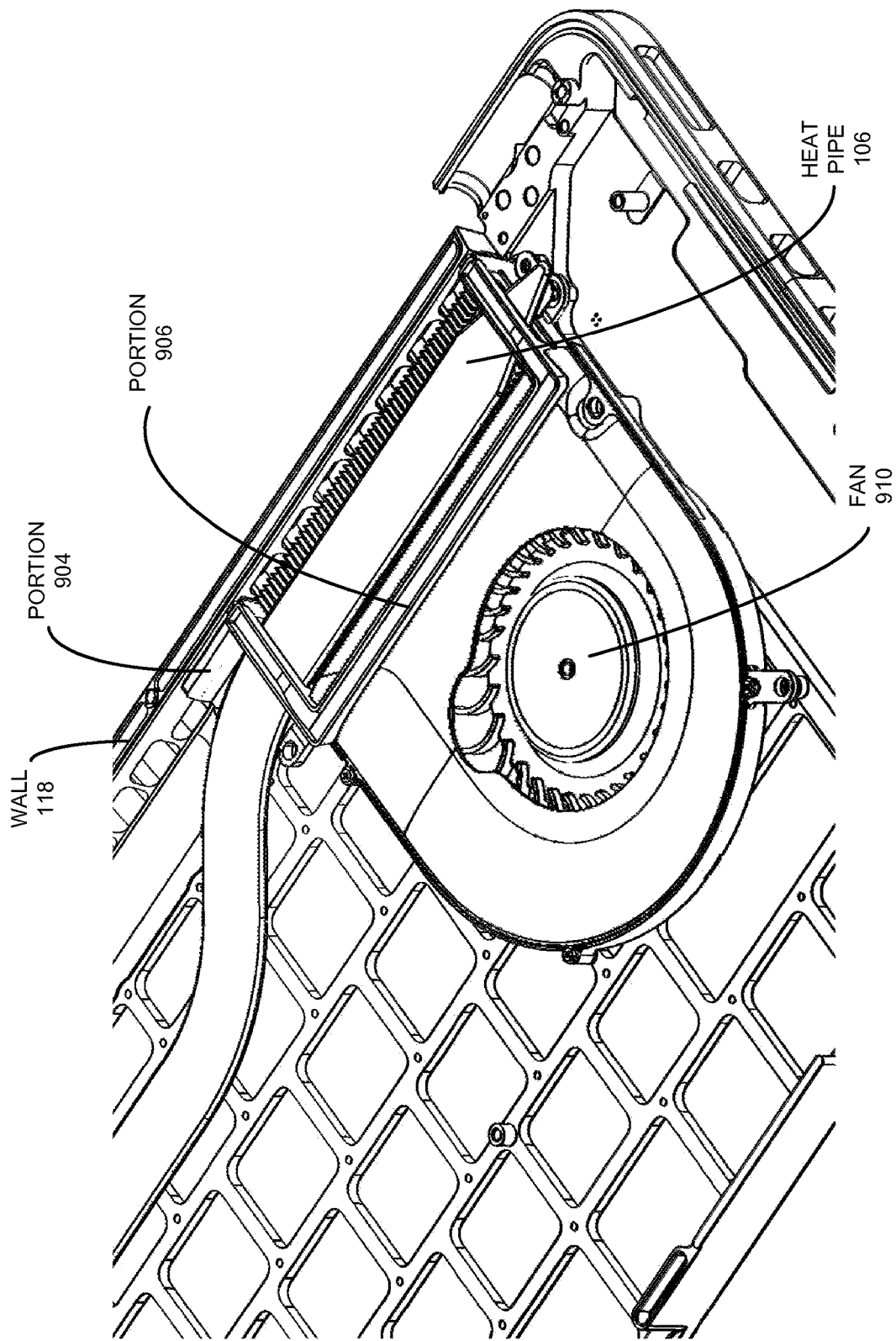
FIG. 11 is a block diagram illustrating a flexible portion of a gasket in accordance with an embodiment of the present disclosure.

FIG. 11 shows flexible portion 906 of a gasket (e.g., gasket 902 of FIG. 9). As shown in FIG. 11, portion 906 may be closed over heat pipe 106, rigid portion 904, and the second flexible portion after heat pipe 106 is assembled in the portable electronic device. The bottom enclosure of the portable electronic device may then be placed over the gasket to create a compression seal around heat pipe 106, fan 910, one or more exhaust vents of wall 118, and/or the top enclosure of the portable electronic device. In addition, the insulating materials used in the gasket may restrict heat transfer between the exhaust and the enclosure of the portable electronic device, thus facilitating safe operation of the portable electronic device.

Figure 12:
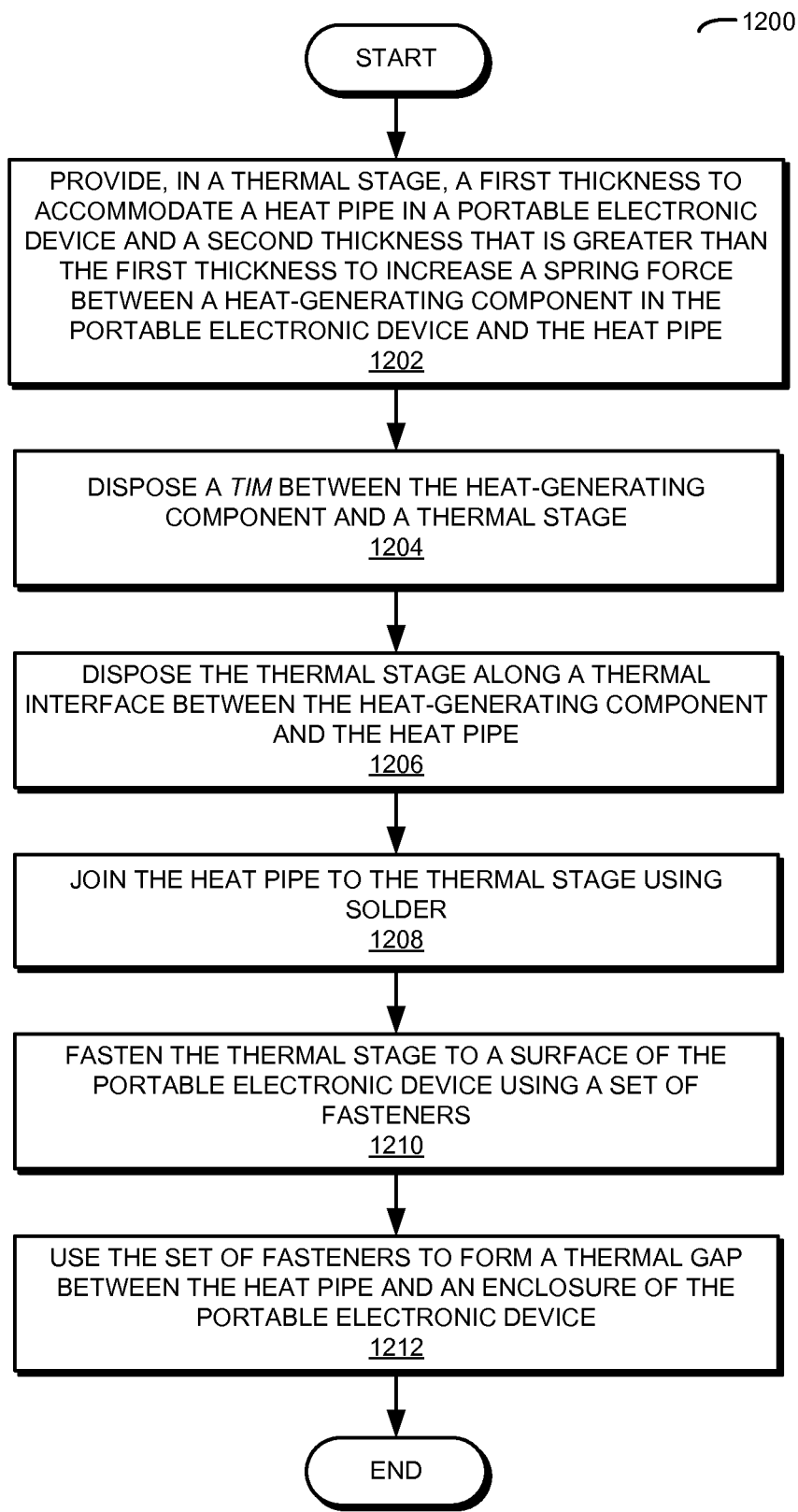
FIG. 12 is a flow chart illustrating a method of facilitating heat transfer in a portable electronic device in accordance with an embodiment of the present disclosure.

FIG. 12 shows a flow chart illustrating a method 1200 of facilitating heat transfer in a portable electronic device. During this method, a first thickness to accommodate a heat pipe in the portable electronic device and a second thickness that is greater than the first thickness to increase a spring force between the heat-generating component and the heat pipe are provided in a thermal stage (operation 1202). The thermal stage may be made of copper titanium and/or another material with a high thermal conductivity and/or spring constant. The first and/or second thicknesses may be created using a machining technique, a rolling technique, a skiving technique, a forging technique, a coining technique, a chemical etching technique, and/or a casting technique.

Next, a TIM is disposed between the heat-generating component and the thermal stage (operation 1204). For example, the TIM may be applied to a surface of the heat-generating component and/or the thermal stage. The thermal stage is then disposed along a thermal interface between the heat-generating component and the heat pipe (operation 1206), and the heat pipe is joined to the thermal stage using a solder (operation 1208). For example, the thermal stage may be placed over the heat-generating component, and the heat pipe may be placed over the thermal stage and soldered to the thermal stage.

The thermal stage is also fastened to a surface within the portable electronic device using a set of fasteners (operation 1210), and the set of fasteners is used to form a thermal gap between the heat pipe and the enclosure of the portable electronic device (operation 1212). For example, the fasteners may include screws with tall heads that form a plenum between the heat pipe and enclosure through which air may flow to further dissipate heat from the heat-generating component. The screws may also separate the heat pipe from the enclosure, thus preventing the heat pipe from transmitting large amounts of heat through the enclosure. Similarly, the heads of the screws may include an insulating material such as plastic to prevent the heat-generating component from thermally contacting the enclosure if the enclosure touches the screws' heads (e.g., as a result of impact between the portable electronic device and a hard surface and/or by design).

Figure 13:
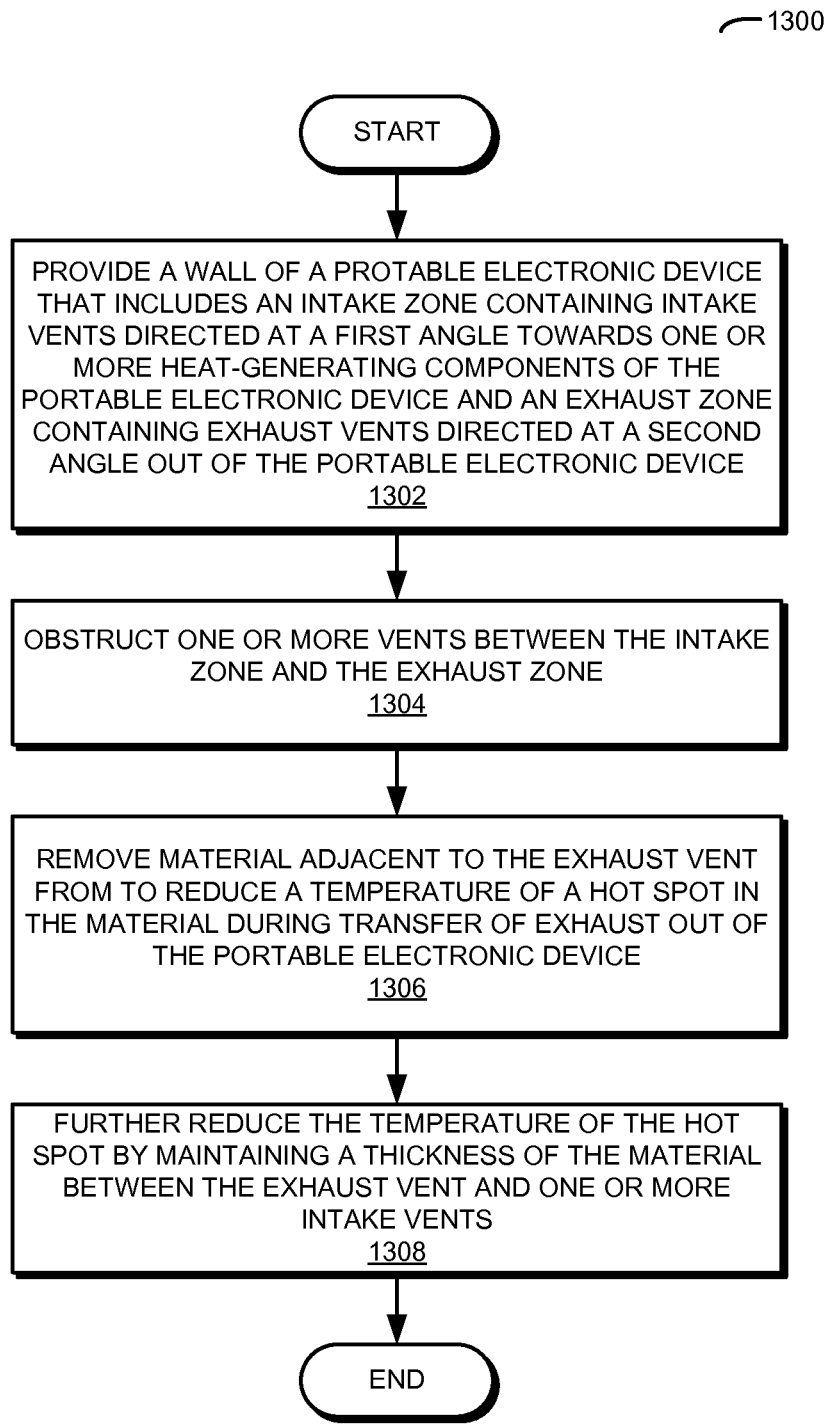
FIG. 13 is a flow chart illustrating a method of facilitating heat transfer in a portable electronic device in accordance with an embodiment of the present disclosure.

FIG. 13 shows a flow chart illustrating a method 1300 of facilitating heat transfer in a portable electronic device. During this method, a wall of the portable electronic device that includes an intake zone containing a set of intake vents directed at a first angle toward one or more heat-generating components of the portable electronic device and an exhaust zone containing a set of exhaust vents directed at a second angle out of the portable electronic device is provided (operation 1302). For example, the wall may be a rear wall that is integrated into a top case of a laptop computer. The first angle may facilitate the cooling of components at the top of a PCB in the laptop computer, while the second angle may direct exhaust out of the laptop computer so that the exhaust avoids the display of the laptop computer.

Next, one or more vents between the intake zone and exhaust zone are obstructed (operation 1304). The vents may be obstructed by a portion of a duct between a fan and the exhaust zone and/or another component in the portable electronic device. The obstructed vents may maintain the cosmetic continuity of the portable electronic device while separating the intake and exhaust flows passing through the intake and exhaust zones.

Material adjacent to the exhaust vent may also be removed to reduce a temperature of a hot spot in the material during the transfer of exhaust out of the portable electronic device (operation 1306). For example, the material may be removed using a T-cut to reduce the amount of heat conducted through the material to the outside of the portable electronic device's enclosure. The temperature of the hotspot may further be reduced by maintaining the thickness of the material between the exhaust vent and one or more intake vents (operation 1308) in the portable electronic device. For example, the thickness of material separating the exhaust vent from an intake vent to the side of the exhaust vent may be maintained to facilitate lateral conduction of heat from the exhaust vent to the intake vent.

Figure 14:
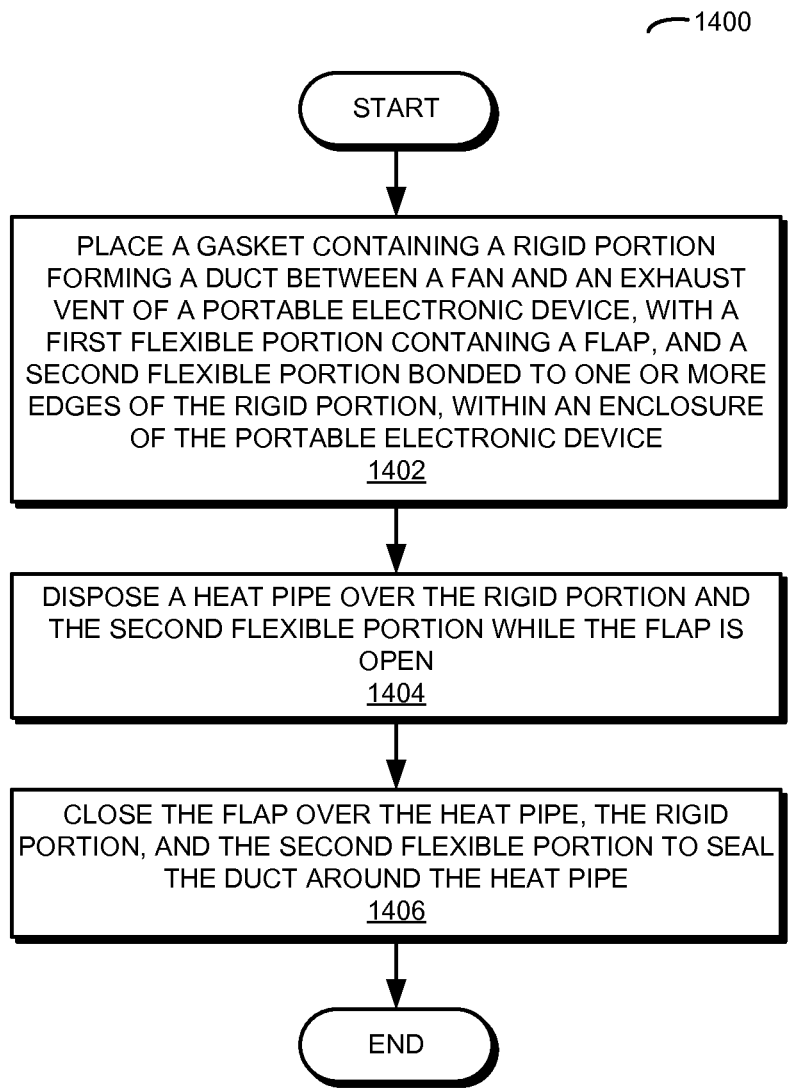
FIG. 14 is a flow chart illustrating a method of assembling a portable electronic device in accordance with an embodiment of the present disclosure.

FIG. 14 shows a flow chart illustrating a method 1400 of assembling a portable electronic device. During this method, a gasket containing a rigid portion forming a duct between a fan and exhaust vent of the portable electronic device, with a first flexible portion containing a flap, and a second flexible portion bonded to one or more edges of the rigid portion, is placed within an enclosure of the portable electronic device (operation 1402). For example, the gasket may be placed inside a top enclosure of the portable electronic device so that one end of the gasket is flush with a wall (e.g., wall 118 of FIG. 1) containing the exhaust vent, and a fan may be installed in the portable electronic device so that the other end of the gasket is flush with the fan. The rigid portion may be made of plastic, while the first and second flexible portions may be made of a rubber that is bonded to the rigid portion using an overmolding technique.

Next, a heat pipe is disposed over the rigid portion and second flexible portion while the flap is open (operation 1404). For example, the heat pipe may be assembled in the portable electronic device so that the heat pipe rests on top of the rigid portion and second flexible portion while the flap is open over the wall.

Moreover, the flap is closed over the heat pipe, the rigid portion, and the second flexible portion to seal the duct around the heat pipe (operation 1406). The first and second flexible portions may also seal the duct around the fan, the bottom enclosure of the portable electronic device, the top enclosure of the portable electronic device, and/or the exhaust vent. The gasket may thus prevent recirculation of exhaust within the portable electronic device, simplify the assembly of the heat pipe and/or portable electronic device, and/or insulate the enclosure of the portable electronic device from the heated exhaust.

Figure 15:
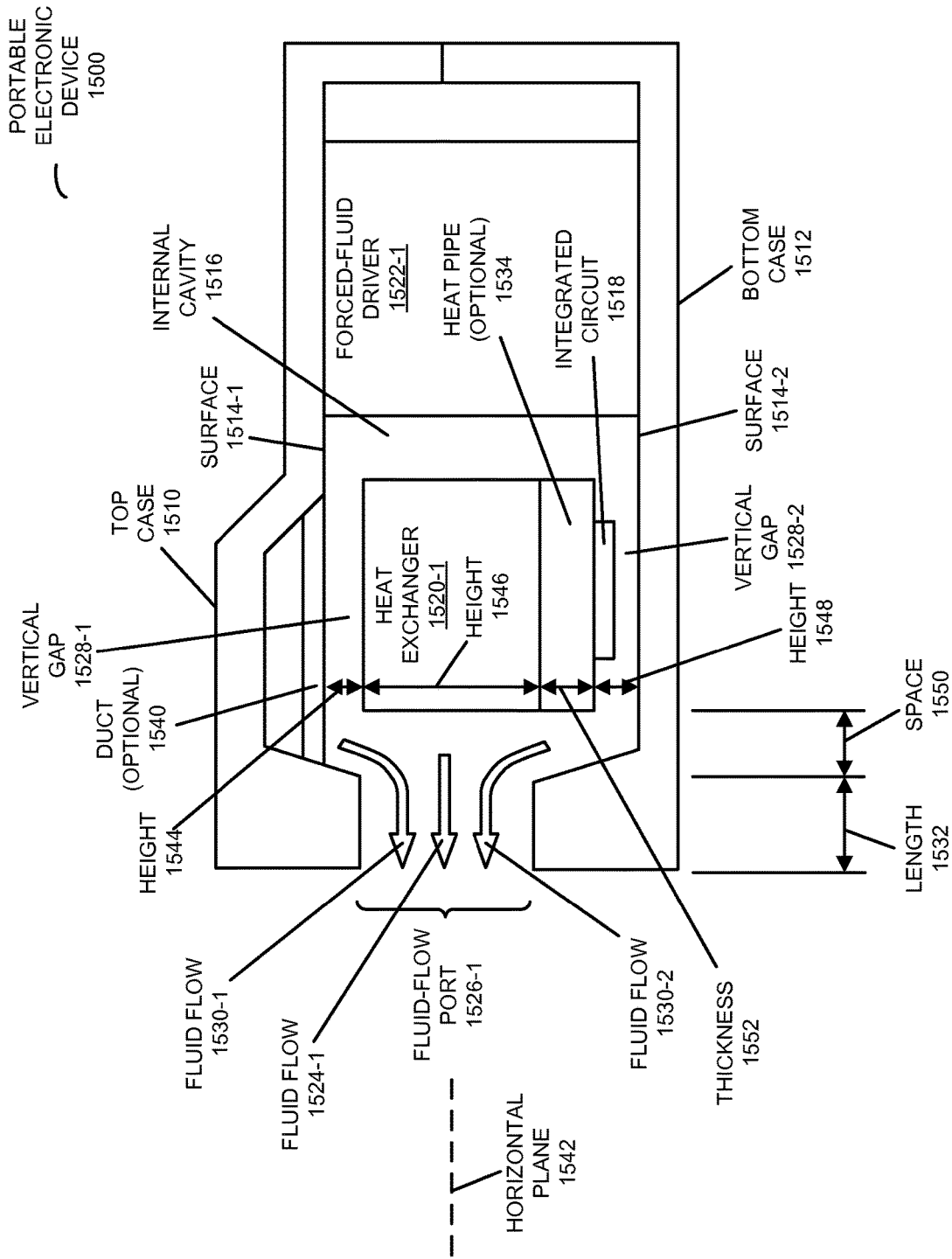
FIG. 15 is a block diagram illustrating a side view of a portable electronic device in accordance with an embodiment of the present disclosure.

We now describe additional embodiments. FIG. 15 presents a block diagram illustrating a side view of a portable electronic device 1500, such as portable electronic device 700 (FIG. 7). This portable electronic device includes an external housing with a top case 1510 and a bottom case 1512 that each has inner surfaces 1514 that define an internal cavity 1516. Internal cavity 1516 includes at least an integrated circuit 1518 that generates heat during operation of portable electronic device 1500. Moreover, one or more heat exchangers 1520 (such as convective-cooling fins) in internal cavity 1516, which are thermally coupled to integrated circuit 1518, may passively transfer the thermal power away from integrated circuit 1518. Furthermore, one or more forced-fluid drivers 1522 (such as one or more fans) in internal cavity 1516 drive one or more fluid flows 1524 (such as a fluid flow in a gas, for example, air) through heat exchanger(s) 1520 and out of portable electronic device 1500 via one or more fluid-flow ports 1526 in the external housing so that, during operation of portable electronic device 1500, the thermal power is transported away from heat exchanger(s) 1520. Note that there are vertical gaps 1528 between heat exchanger(s) 1520 and top case 1510 and bottom case 1512 so that, during operation of portable electronic device 1500, additional fluid flows 1530 (such as an additional fluid flow in a gas, for example, air) through vertical gaps 1528 are located above and below fluid flow(s) 1524.

After passing through heat exchanger(s) 1520 during operation of portable electronic device 1500, a temperature of fluid flow(s) 1524 may be higher than those of additional fluid flows 1530. Furthermore, fluid-flow port(s) 1526 may have a length 1532, and mixing of additional fluid flows 1530 and fluid flow(s) 1524 may be at most partial over length 1532.

Figure 16:
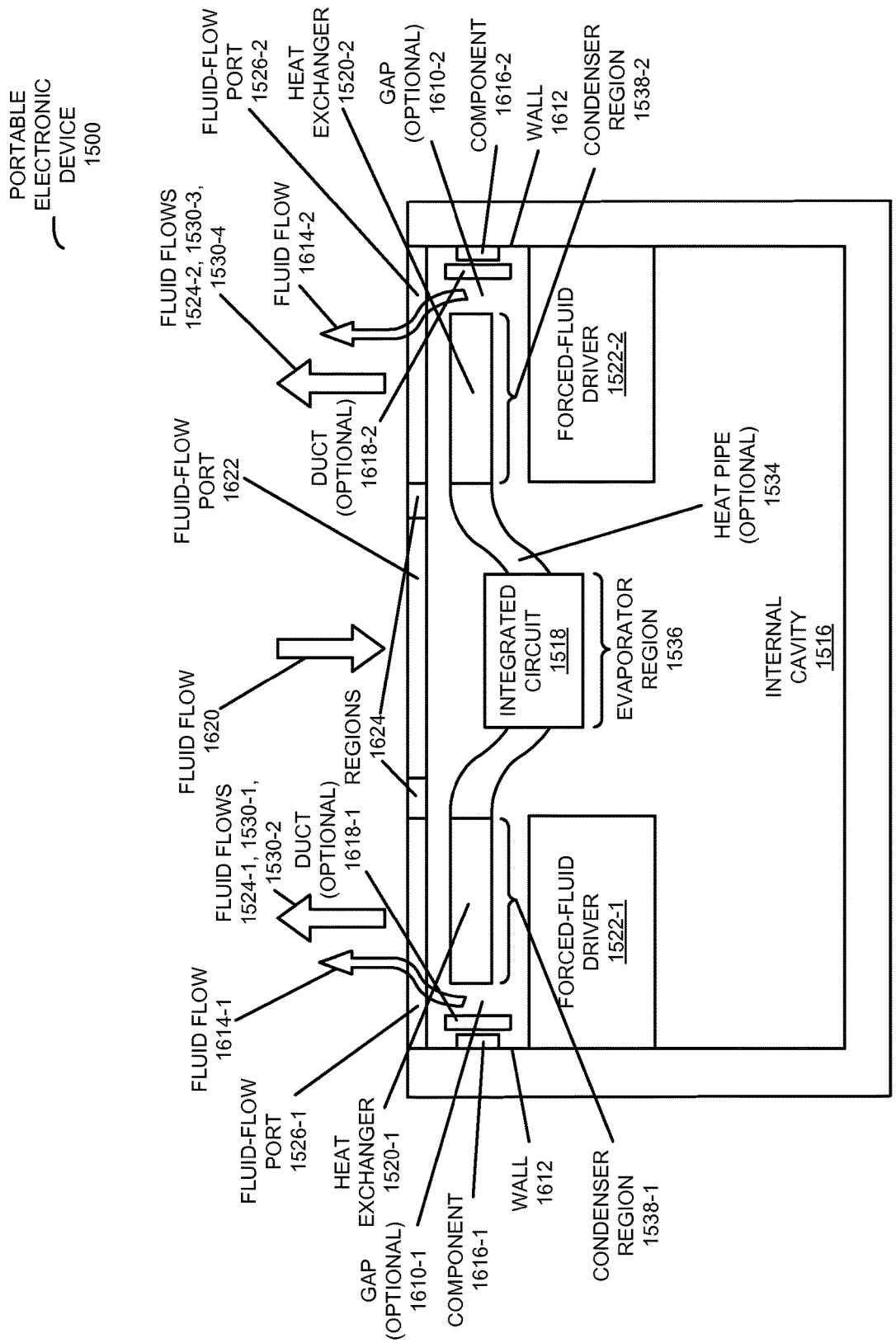
FIG. 16 is a block diagram illustrating a top view of a portable electronic device in accordance with an embodiment of the present disclosure.

As shown in FIG. 16, which presents a block diagram illustrating a top view of portable electronic device 1500, in some embodiments interval cavity 1516 includes an optional heat pipe 1534 thermally coupled to integrated circuit 1518 at an evaporator region 1536 of optional heat pipe 1534. During operation of portable electronic device 1500, optional heat pipe 1534 may transport the thermal power from evaporator region 1536 to one or more condenser regions 1538 of optional heat pipe 1534, and heat exchanger(s) 1520 may be thermally coupled to optional heat pipe 1534 at condenser region(s) 1538.

Referring back to FIG. 15, additionally internal cavity 1516 may include one or more optional ducts, such as optional duct 1540, located above heat exchanger(s) 1520 and mechanically coupled to top case 1510, which guide the upper additional fluid flows, such as additional fluid flow 1530-1 shown in FIG. 15, over a top of heat exchanger(s) 1520. By guiding the upper additional fluid flows in this way, and in particular by keeping the upper additional fluid flows away from top case 1510, optional duct 1540 may ensure that there is not excessive heating of top case 1510, which may be noticed by a user of portable electronic device 1500.

Figure 17:
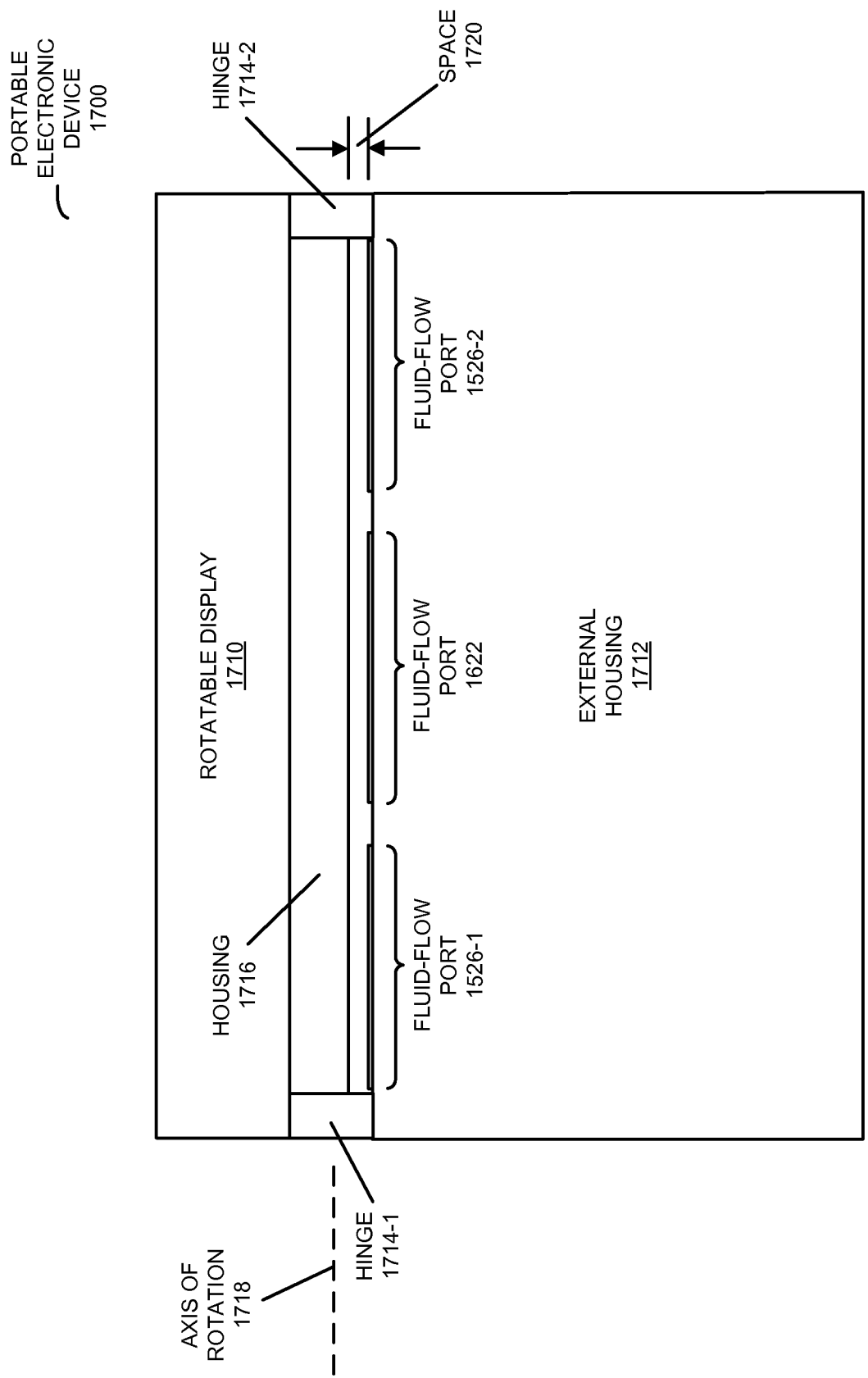
FIG. 17 is a block diagram illustrating a top view of a portable electronic device in accordance with an embodiment of the present disclosure.

In an exemplary embodiment, vertical gap 1528-1 has a height 1544 of 2.5 mm, heat exchanger(s) 1520 have height(s) 1546 of 4-5 mm, and vertical gap 1528-2 has a height 1548 of 1 mm. Moreover, a space 1550 between heat exchanger(s) 1520 and fluid-flow port(s) 1526 may be 2 mm, length 1532 may be 4 mm, and (as shown below in FIG. 17) there may be a space 1720 (FIG. 17) of 4-5 mm between fluid-flow port(s) 1526 and housing 1716 (FIG. 17). Furthermore, optional heat pipe 1534 may have a thickness 1552 of less than or equal to 1.3 mm.

By including vertical gaps 1528, portable electronic device 1500 may output heat in higher temperature fluid flow(s) 1524 sandwiched between lower temperature, additional fluid flows 1530. As described below with reference to FIGS. 17-20, this may allow a thermal impact of higher temperature fluid flow(s) 1524 on a display (such as a liquid-crystal display) in the portable electronic device to be reduced or eliminated. Therefore, by intentionally reducing the thermal efficiency of heat exchanger(s) 1520 by reducing their height along bypass flows (i.e., additional fluid flows 1530), portable electronic device 1500 may reduce or eliminate color changes and other visual artifacts that can degrade the quality of a displayed image on the display.

As shown in FIG. 16, instead of or in addition to vertical gaps 1528 around heat exchanger(s) 1520, in some embodiments there may be one or more optional horizontal gaps 1610 between heat exchanger(s) 1520 and wall(s) 1612 of internal cavity 1516 in a horizontal plane 1542 (FIG. 15) of heat exchanger(s) 1520 so that one or more additional fluid flows 1614 flow through optional gap(s) 1610. Once again, fluid flow(s) 1524 may have a higher temperature than that of additional fluid flow(s) 1614, and mixing of additional fluid flow(s) 1614 and fluid flow(s) 1524 may be at most partial over length 1532 (FIG. 15) of fluid-flow port(s) 1526.

Furthermore, portable electronic device 1500 may include: one or more components 1616 adjacent to wall(s) 1612 of internal cavity 1516, where optional gap(s) 1610 are located; and one or more optional duct(s) 1618, located in optional gap(s) 1610, which guide additional fluid flow(s) 1614 over component(s) 1616. For example, component(s) 1616 may be temperature sensitive, and optional duct(s) 1618 may ensure that additional fluid flow(s) 1614 pass over component(s) 1616 without heating them. Thus, once again, the efficiency of heat exchanger(s) 1520 may be intentionally reduced using bypass flows to reduce or eliminate heating of temperature-sensitive components in the portable electronic device.

FIG. 17 presents a block diagram illustrating a top view of a portable electronic device 1700, such as portable electronic device 700 (FIG. 7). This portable electronic device includes a rotatable display 1710 that is mechanically coupled to external housing 1712 by a hinge 1714. As shown in FIG. 20, which presents a block diagram illustrating a side view of a portable electronic device 1700, rotatable display 1710 (FIG. 17) and housing 1716 have a configurable angular position 2010 relative to a plane 2012 of top case 1510 in external housing 1712 (FIG. 17).

Referring back to FIG. 17, portable electronic device 1700 includes a housing 1716 (such as a clutch barrel) that at least partially encloses hinge 1714 along an axis of rotation 1718 of rotatable display 1710. As discussed previously, during operation of portable electronic device 1700, fluid-flow port(s) 1526 in external housing 1712 direct fluid flows 1524 and 1530 (FIG. 15) out of internal cavity 1516 (FIG. 15). These fluid flows include central fluid flow(s) 1524 (FIG. 15) sandwiched between additional fluid flows 1530 (FIG. 15), where central fluid flow(s) 1524 (FIG. 15) have a higher temperature than those of additional fluid flows 1530 (FIG. 15). Housing 1716 may direct central fluid flow(s) 1524 (FIG. 15) away from rotatable display 1710 over a range of angular positions of rotatable display 1710. For example, the range of angular positions may include approximately 0° (which is described further below with reference to FIGS. 18 and 19) and approximately between 90° to 110° or 135° (which is described further below with reference to FIG. 20, and was also described previously with reference to FIGS. 7 and 8).

Figure 18:
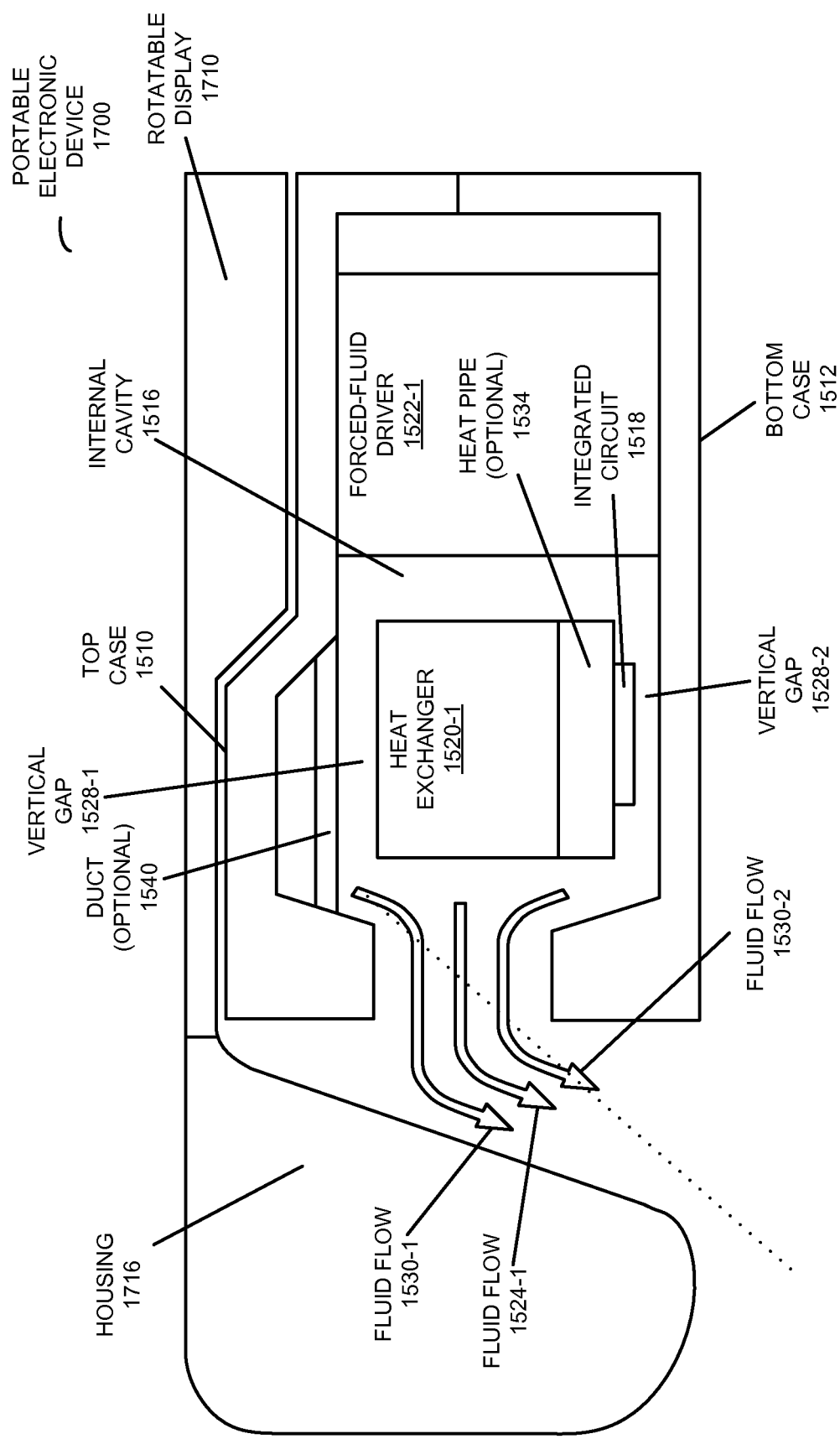
FIG. 18 is a block diagram illustrating a side view of the portable electronic device of FIG. 17 in accordance with an embodiment of the present disclosure.
Figure 19:
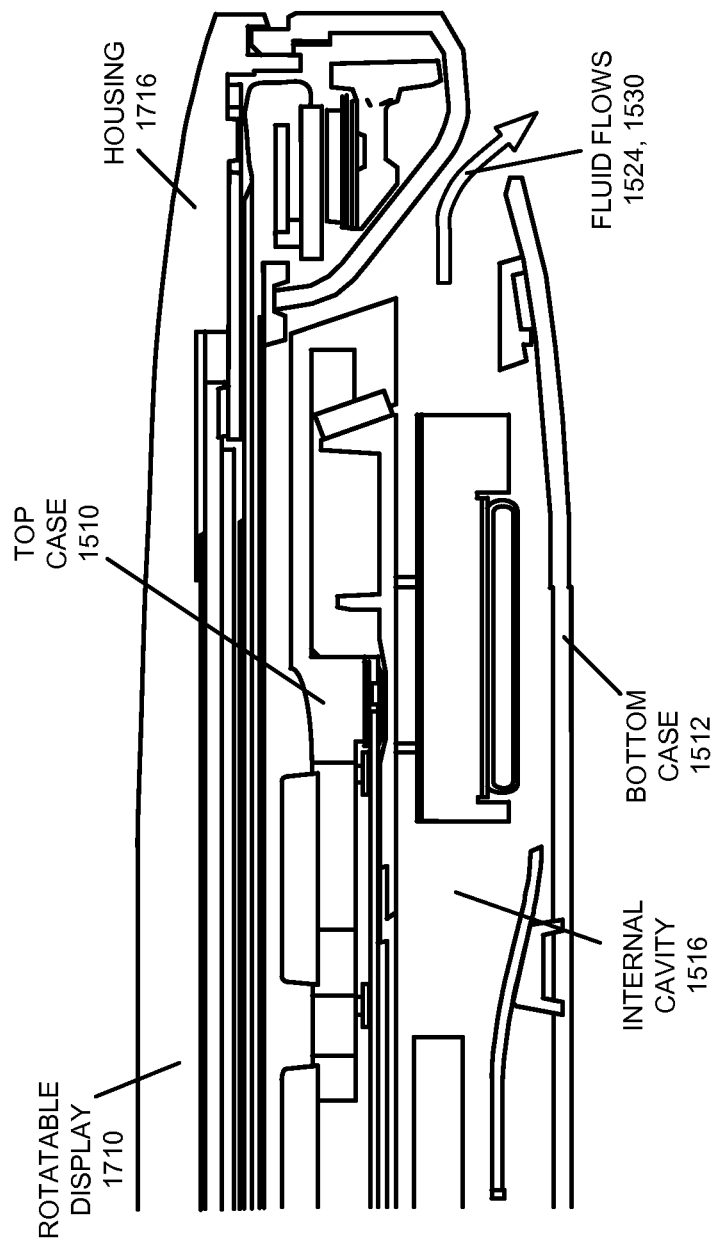
FIG. 19 is a block diagram illustrating a side view of the portable electronic device of FIG. 17 in accordance with an embodiment of the present disclosure.

As shown in FIG. 18, which presents a block diagram illustrating a side view of a portable electronic device 1700, when angular position 2010 (FIG. 20) is approximately 0° (i.e., in a closed position), housing 1716 may direct central fluid flow(s) 1524, such as fluid flow 1524-1, out of portable electronic device 1700. In particular, housing 1716 may provide a ramp feature for this purpose. In the process, housing 1716 may ensure that the cooling of portable electronic device 1700 is the same when rotatable display 1710 is in an open or closed position, and therefore that the performance of portable electronic device 1700 is the same independent of angular position 2010 (FIG. 20). This configuration is further illustrated in FIG. 19.

Figure 20:
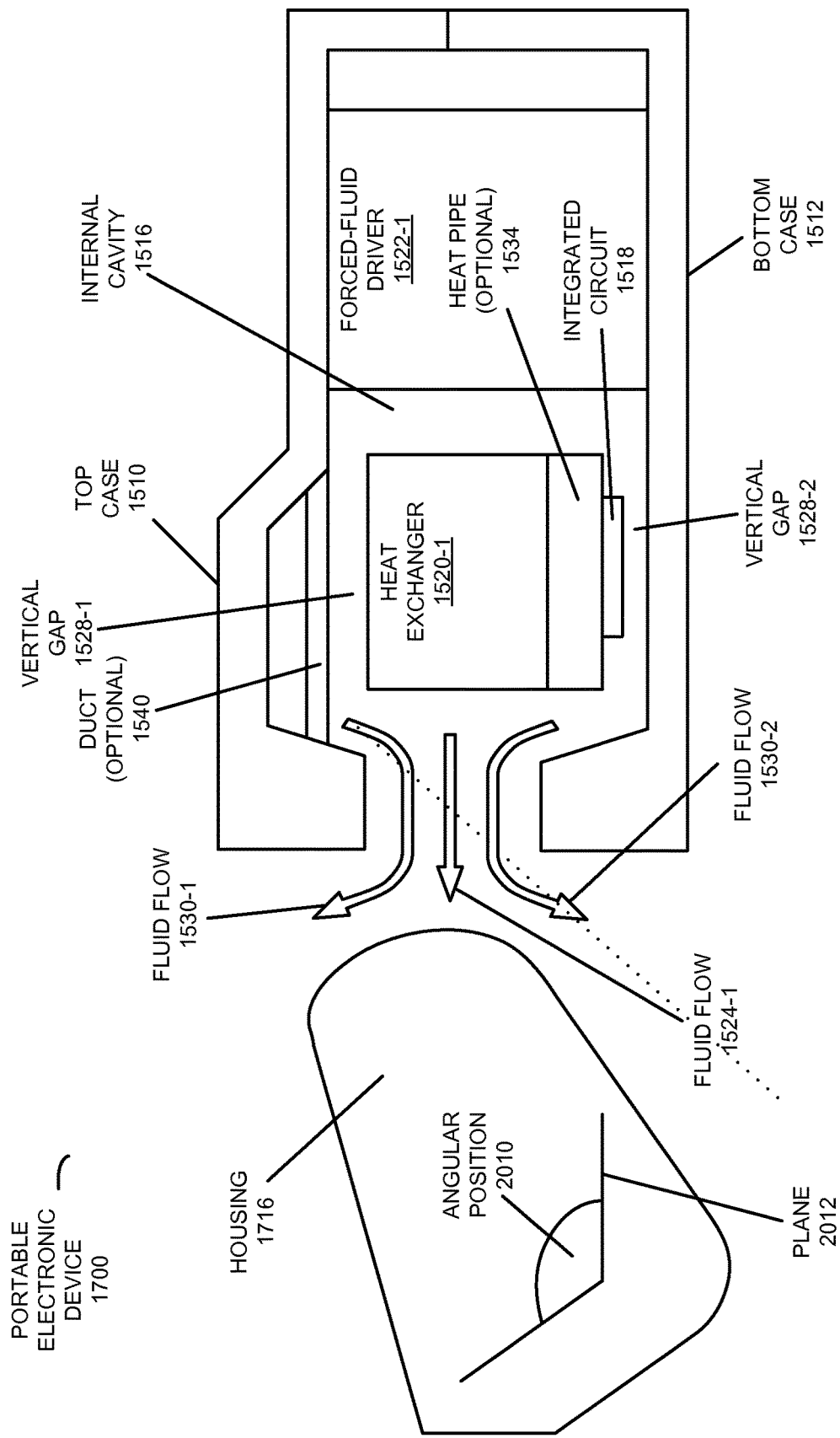
FIG. 20 is a block diagram illustrating a side view of the portable electronic device of FIG. 17 in accordance with an embodiment of the present disclosure.

Furthermore, as shown in FIG. 20, when angular position 2010 is approximately between 90° and 110° (i.e., in an open position), housing 1716 may direct central fluid flow(s) 1524, such as fluid flow 1524-1, into housing 1716, and may direct additional fluid flow 1530-1 to rotatable display 1710 (FIG. 17) and additional fluid flow 1530-2 out of portable electronic device 1700. (Note that when angular position 2010 is less than 90° it may be difficult for a user of portable electronic device 1700 to view information on rotatable display 1710.) Thus, additional fluid flows 1530 may provide an air curtain around central fluid flow(s) 1524 which is directed toward rotatable display 1710 (FIG. 17) to reduce or eliminate heating of rotatable display 1710 (FIG. 17).

Referring back to FIG. 17, in some embodiments, during operation of portable electronic device 1700, housing 1716 may reduce a flow impedance of fluid flow 1620 (FIG. 16) in fluid-flow port 1622 (FIG. 16) into portable electronic device 1700. For example, there may be an unimpeded path into internal cavity 1516 (FIG. 15), as illustrated by the dotted line in FIGS. 18 and 20, which may facilitate fluid flow 1620 (FIG. 16). Note that fluid flow 1620 (FIG. 16) may be separated by regions 1624 (FIG. 16) without fluid flows into or out of portable electronic device 1700. Additionally, during operation of portable electronic device 1700, housing 1716 may direct a portion of fluid flow 1620 (FIG. 16) over an integrated circuit, such as integrated circuit 1518 (FIG. 15).

We now describe embodiments of methods that can be performed using the preceding embodiments. FIG. 21 presents a flowchart illustrating a method 2100 for cooling a cavity (such as internal cavity 1516 in FIG. 15) in portable electronic device 1500 (FIGS. 15 and 16). During operation of the portable electronic device, the forced-fluid driver generates the fluid flow through the heat exchanger in the cavity so that thermal power associated with operation of the integrated circuit in the cavity is transported out of the cavity (operation 2110). Moreover, the forced-fluid driver generates additional fluid flows through the vertical gaps between the heat exchanger and the walls of the cavity so that the additional fluid flows through the vertical gaps are located above and below the fluid flow (operation 2112).

FIG. 22 presents a flowchart illustrating a method 2200 for cooling a cavity in the portable electronic device 1500 (FIGS. 15 and 16). During operation of the portable electronic device, the forced-fluid driver generates the fluid flow through the heat exchanger in the cavity so that thermal power associated with operation of the integrated circuit in the cavity is transported out of the cavity (operation 2110). Moreover, the forced-fluid driver generates an additional fluid flow through the gap between the heat exchanger and the wall of the cavity in a horizontal plane of the heat exchanger so that an additional fluid flow flows through the gap (operation 2212).

FIG. 23 presents a flowchart illustrating a method 2300 for cooling a cavity in the portable electronic device 1700 (FIGS. 17-20). During operation of the portable electronic device, the forced-fluid driver generates fluid flows through the fluid-flow port so that thermal power associated with operation of at least an integrated circuit in the cavity is transported out of the cavity (operation 2310), where the fluid flows include the central fluid flow sandwiched between two additional fluid flows, and the central fluid flow has the higher temperature than those of the additional fluid flows. Moreover, the housing directs the central fluid flow away from the rotatable display in the portable electronic device that at least partially encloses the hinge that facilitates the configurable angular position of the rotatable display relative to the plane of the top case in the portable electronic device (operation 2312). Note that the central fluid flow is directed away from the rotatable display over the range of angular positions of the rotatable display.

In some embodiments, the housing optionally reduces the flow impedance of the other fluid flow in the other fluid-flow port into the portable electronic device. Additionally, the housing may optionally direct the portion of the other fluid flow over at least the integrated circuit.

In some embodiments of methods 1200 (FIG. 12), 1300 (FIG. 13), 1400 (FIG. 14), 2100 (FIG. 21), 2200 (FIG. 22) or 2300 there may be additional or fewer operations. Moreover, the order of the operations may be changed, and/or two or more operations may be combined into a single operation.

Figure 24:
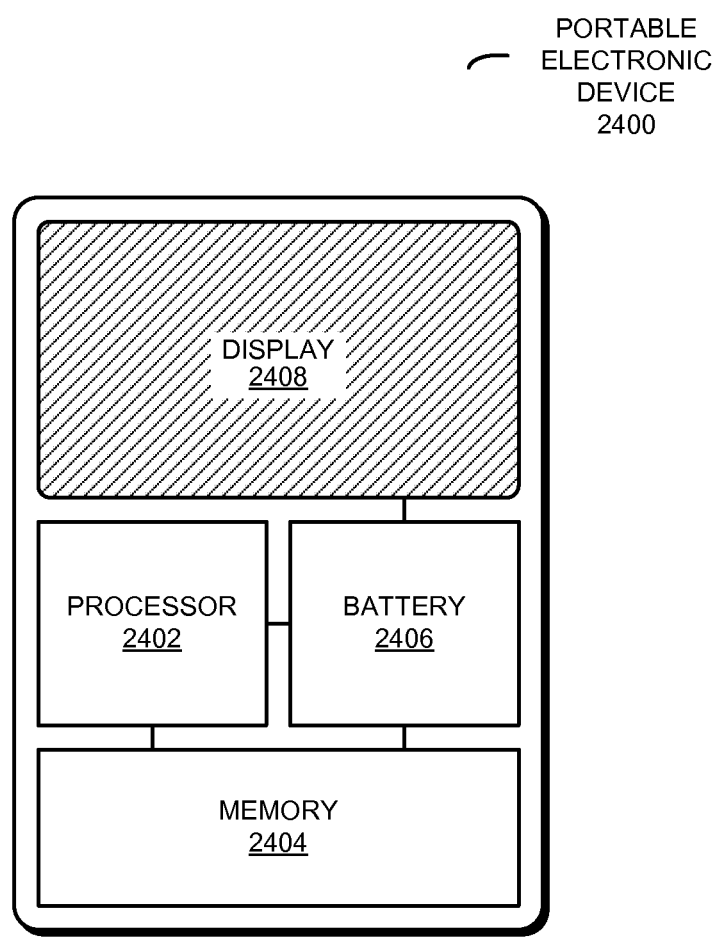
FIG. 24 is a block diagram illustrating a portable electronic device in accordance with an embodiment of the present disclosure.

The above-described heat transfer mechanisms can generally be used in any type of electronic device. For example, FIG. 24 illustrates a portable electronic device 2400 which includes a processor 2402, a memory 2404 and a display 2408, which are all powered by a battery 2406. This portable electronic device may include: one or more program modules or sets of instructions stored in an optional memory subsystem (not shown). These sets of instructions may be executed by an optional processing subsystem (such as one or more processors) on a motherboard (not shown). Note that the one or more computer programs may constitute a computer-program mechanism. Moreover, instructions in the various modules in the optional memory subsystem may be implemented in: a high-level procedural language, an object-oriented programming language, and/or in an assembly or machine language. Furthermore, the programming language may be compiled or interpreted, e.g., configurable or configured, to be executed by the optional processing subsystem.

In some embodiments, functionality in these circuits, components and devices may be implemented in one or more: application-specific integrated circuits (ASICs), field-programmable gate arrays (FPGAs), and/or one or more digital signal processors (DSPs). Moreover, the circuits and components may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

Portable electronic device 2400 may include one of a variety of devices that can include memory, including: a laptop computer, a media player (such as an MP3 player), an appliance, a subnotebook/netbook, a tablet computer, a smartphone, a cellular telephone, a network appliance, a personal digital assistant (PDA), a toy, a controller, a digital signal processor, a game console, a device controller, a computational engine within an appliance, a consumer-electronic device, a portable computing device, a digital camera, a personal organizer, and/or another electronic device, such as another type of battery-powered electronic device.

In order to cool heat-generating components in portable electronic device 2400, portable electronic device 2400 may include a heat pipe that conducts heat away from the heat-generating components and/or one or more fans that expel the heat out of portable electronic device 2400.

Portable electronic device 2400 may also include a thermal stage disposed along a thermal interface between a heat-generating component and the heat pipe. The thermal stage may include a first thickness to accommodate the heat pipe and a second thickness that is greater than the first thickness to increase the spring force between the heat-generating component and the heat pipe. The thermal stage may also be fastened to a surface within portable electronic device 2400 by a set of fasteners that form a thermal gap between the heat pipe and the enclosure of portable electronic device 2400.

Moreover, in order to further facilitate cooling of the heat-generating components, a wall of portable electronic device 2400 may include an intake zone containing a set of intake vents directed at a first angle toward one or more of the heat-generating components. The wall may also include an exhaust zone containing a set of exhaust vents directed at a second angle out of the electronic device (e.g., to avoid a display of the electronic device). One or more vents may be obstructed between the intake and exhaust zones to separate the intake and exhaust zones. In addition, the temperature of a hot spot near an exhaust vent may be reduced by removing material adjacent to the exhaust vent and/or maintaining a thickness of the material between the exhaust vent and one or more intake vents.

Furthermore, a gasket may prevent the recirculation of exhaust inside the electronic device. The gasket may include a rigid portion that forms a duct between a fan and an exhaust vent. The gasket may also include a first flexible portion bonded to the rigid portion, as well as a second flexible portion bonded to one or more edges of the rigid portion. The first flexible portion may be a flap that is open during assembly of the heat pipe in the electronic device and closed over the heat pipe and the rigid portion to seal the duct around the heat pipe after the assembly. The first and second flexible portions may further seal the duct around the fan, the bottom enclosure of the electronic device, the top enclosure of the electronic device, and/or the exhaust vent.

While a portable electronic device was used as an illustration in the preceding discussion, in other embodiments the heat-transfer technique is included in an electronic device, such as a server, a desktop computer, a mainframe computer and/or a blade computer.

Additionally, one or more of the components may not be present in the FIGS. 1-11 and 15-20. In some embodiments, the preceding embodiments include one or more additional components that are not shown in FIGS. 1-11 and 15-20. Also, although separate components are shown in FIGS. 1-11 and 15-20, in some embodiments some or all of a given component can be integrated into one or more of the other components and/or positions of components can be changed.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A portable electronic device comprising:
  a housing having a top case and a bottom case, the housing carrying:
  an electronic component that generates thermal energy during operation of the electronic component;
  a heat exchanger thermally coupled to the electronic component, wherein the heat exchanger receives a coolant capable of carrying at least some of the thermal energy that is generated by the electronic component;
  a fan assembly that generates an air flow, wherein the air flow comprises (i) a first air flow that impinges on the heat exchanger and transports a first amount of the thermal energy through a port located at a first sidewall, and (ii) a second air flow that transports a second amount of the thermal energy through a gap located between the heat exchanger and a second sidewall, wherein mixing of the first air flow and the second air flow occurs at the port; and
  an air flow duct located between the heat exchanger and the second sidewall, wherein the air flow duct directs a portion of the second airflow away from an additional component adjacent the second sidewall within the gap.

2. The portable electronic device of claim 1, wherein the heat exchanger includes convective-cooling fins.

3. The portable electronic device of claim 1, wherein a conduit transports the coolant from the electronic component to the heat exchanger.

4. The portable electronic device of claim 1, wherein the first air flow is adjacent to the second air flow.

5. The portable electronic device of claim 1, wherein the air flow duct prevents the second air flow from passing over the additional component.

6. The portable electronic device of claim 1, further comprising a heat pipe thermally coupled to the electronic component at an evaporator region of the heat pipe, wherein, during operation of the electronic component, the heat pipe transports the thermal energy from the evaporator region to a condenser region of the heat pipe.

7. The portable electronic device of claim 1, further comprising a display coupled to the bottom case, and the second air flow minimizes visual artifacts associated with a display coupled to the housing during the operation of the electronic component.

8. A portable electronic device including a housing having a top case and a bottom case, the portable electronic device comprising:
an integrated circuit that generates thermal energy during operation of the integrated circuit;
a heat exchanger thermally coupled to the integrated circuit, wherein the heat exchanger receives the thermal energy generated by the integrated circuit;
a forced-fluid driver configured to generate an air flow, wherein the air flow comprises (i) a first fluid flow that impinges on the heat exchanger and transports a first amount of thermal energy through the heat exchanger so as to cause the first amount of thermal energy to be expelled via a fluid-flow port included on a first sidewall of the housing, and (ii) a second fluid flow that transports a second amount of thermal energy through a gap formed between the heat exchanger and a second sidewall of the housing, wherein the first air flow and the second air flow are mixed at the fluid-flow port; and
an air flow duct located in the gap, wherein the air flow duct directs a portion of the second fluid flow away from an additional component adjacent the second sidewall within the gap.

9. The portable electronic device of claim 8, wherein the heat exchanger includes convective-cooling fins.

10. The portable electronic device of claim 8, wherein the forced-fluid driver includes a fan.

11. The portable electronic device of claim 8, wherein the first fluid flow has a higher temperature than the second fluid flow.

12. The portable electronic device of claim 8, wherein the forced-fluid driver has a width greater than the heat exchanger.

13. The portable electronic device of claim 8, wherein the first fluid flow has a greater amount of thermal energy than the second fluid flow.

14. The portable electronic device of claim 8, wherein mixing of the first fluid flow and the second fluid flow occurs along the fluid-flow port.

15. The portable electronic device of claim 8, further comprising a heat pipe thermally coupled to the integrated circuit at an evaporator region of the heat pipe, wherein the heat pipe transports the thermal energy from the evaporator region to a condenser region of the heat pipe.

16. A method for cooling a portable electronic device, the portable electronic device including a housing having a top case and a bottom case, the method comprising:
at a fan assembly, wherein the housing carries the fan assembly and an electronic component that generates thermal energy:
generating a first air flow that transports a first amount of thermal energy through a heat exchanger disposed within the housing, so as to cause the first amount of thermal energy to be expelled via a port included on a first sidewall of the housing; and
generating a second air flow that transports a second amount of thermal energy through a gap that is included between the heat exchanger and a second sidewall of the housing, wherein a portion of the second air flow is directed through an air flow duct located in the gap, and wherein the air flow duct directs a portion of the second fluid flow away from an additional component adjacent the second sidewall within the gap, wherein the first air flow has a higher temperature than the second air flow.

17. A portable electronic device, comprising:
an external housing including a top case and a bottom case, and each of the top case and the bottom case include inner surfaces that define an internal cavity, wherein the internal cavity includes an integrated circuit configured to generate heat during operation of the portable electronic device;
a lid coupled to the external housing by a hinge, wherein the lid includes a display, and the lid is configured to be angularly positioned relative to a plane of the top case; and
a housing at least partially enclosing the hinge along an axis of rotation of the lid, wherein, during operation of the portable electronic device, a fluid-flow port carried by the external housing directs a plurality of fluid flows from the internal cavity,
wherein the plurality of fluid flows include a central fluid flow flowing between a plurality of additional fluid flows, and
the central fluid flow has a higher temperature than the plurality of additional fluid flows, and
wherein the housing is configured to direct the central fluid flow away from the display over one or more angular positions of the lid.

18. The portable electronic device of claim 17, wherein a forced-fluid driver in the internal cavity generates the plurality of fluid flows.

19. The portable electronic device of claim 18, wherein the forced-fluid driver includes a fan.

20. The portable electronic device of claim 17, wherein the lid is capable of being positioned at angles between approximately 0° and approximately 110°.

21. The portable electronic device of claim 17, wherein, when the lid is positioned at an angle of approximately 0°, the housing is configured to direct the central fluid flow from the portable electronic device.

22. The portable electronic device of claim 17, wherein, when the lid is positioned at an angle range approximately between 90° and 110°, the housing directs the central fluid flow into the housing, and directs at least one of the plurality of additional fluid flows to the lid and at least one of the plurality of additional fluid flows out of the portable electronic device.

23. The portable electronic device of claim 17, wherein, during operation of the portable electronic device, the housing is configured to reduce a flow impedance of at least one of the plurality of fluid flows into the portable electronic device.

24. The portable electronic device of claim 17, wherein, during operation of the portable electronic device, the housing is configured to direct a portion of at least one of the plurality of fluid flows over the integrated circuit.

25. The portable electronic device of claim 17, wherein the plurality of fluid flows include a gas.

26. The portable electronic device of claim 25, wherein the gas includes air.

27. A method for cooling a cavity of a housing of a portable electronic device having a lid that includes display, wherein the lid is configured to be angular positioned relative to a top case of the housing via a hinge, the method comprising:
    using a forced-fluid driver, generating a plurality of fluid flows through a fluid-flow port of the portable electronic device so that thermal energy associated with operation of an integrated circuit included in the cavity is drawn from the cavity, wherein the plurality of fluid flows include a central fluid flow that flows between a plurality of additional fluid flows, and wherein the central fluid flow has a higher temperature than the plurality of additional fluid flows; and
    directing the central fluid flow away from the lid by adjusting the hinge that is configured to rotate the lid according to a range of one or more angular positions relative to a plane of the top case, wherein the central fluid flow is directed from the display over the range of the one or more angular positions.

28. The method of claim 27, wherein the integrated circuit is positioned between the forced-fluid driver and the fluid-flow port.

29. The method of claim 28, wherein the forced-fluid driver includes a fan.

30. The method of claim 27, wherein the range of the one or more angular positions is between approximately 0° and approximately 110°.

31. The method of claim 27, wherein, when the range of the one or more angular positions is approximately 0°, the housing directs the central fluid flow out of the portable electronic device.

32. The method of claim 27, wherein, when the range of the one or more angular positions is approximately between 90° and 110°, the housing directs the central fluid flow into the housing, and directs one of the plurality of additional fluid flows to the display and one of the plurality of additional fluid flows out of the portable electronic device.

33. The method of claim 27, wherein the method further comprises:
    reducing a flow impedance of at least one of the plurality of fluid flows that are drawn into the portable electronic device using the housing.

34. The method of claim 33, wherein the method further comprises:
    directing a portion of at least one of the plurality of fluid flows over the integrated circuit.

35. The method of claim 27, wherein the plurality of fluid flows include a gas.

36. The method of claim 35, wherein the gas includes air.

* * * * *